(12) United States Patent
An et al.

(10) Patent No.: US 12,719,453 B2
(45) Date of Patent: Aug. 25, 2026

(54) DRIVE SIGNAL SUPPLY DEVICE AND DRIVE SIGNAL CALIBRATING METHOD THEREOF

(71) Applicant: SAMSUNG ELECTRONICS CO., LTD., Suwon-si (KR)

(72) Inventors: Eunji An, Suwon-si (KR); Kyoungtae Kang, Suwon-si (KR); Jehoon Kim, Suwon-si (KR); Byungjoo Oh, Suwon-si (KR); Hyunsuk Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 18/441,084

(22) Filed: Feb. 14, 2024

(65) Prior Publication Data

US 2025/0047265 A1 Feb. 6, 2025

(30) Foreign Application Priority Data

Aug. 4, 2023 (KR) ........................ 10-2023-0102163

(51) Int. Cl.
*H03K 3/011* (2006.01)
*H03K 3/03* (2006.01)

(52) U.S. Cl.
CPC ........... *H03K 3/011* (2013.01); *H03K 3/0315* (2013.01)

(58) Field of Classification Search
None
See application file for complete search history.

(56) References Cited

U.S. PATENT DOCUMENTS 7,463,096 B2 * 12/2008 Chi ........................ G06F 1/3296 331/49
7,548,823 B2 * 6/2009 Singh ................. G01R 31/3016 702/57
7,592,876 B2 * 9/2009 Newman ............ G01R 31/2856 331/2
7,859,421 B2 12/2010 Berthold et al.
8,008,967 B2 8/2011 Okano et al.
8,339,190 B2 * 12/2012 Otsuga ............. G01R 31/31725 327/540

(Continued)

FOREIGN PATENT DOCUMENTS

JP 1999-163691 A2 6/1999
JP 2003-115750 A2 4/2003

(Continued)

*Primary Examiner* — Thomas J. Hiltunen
(74) *Attorney, Agent, or Firm* — Morgan, Lewis & Bockius LLP

(57) ABSTRACT

A drive signal supply device includes an oscillation circuit, a drive signal generation circuit, and a control circuit. The oscillation circuit includes a plurality of oscillators each including inverters and outputs a plurality of oscillation signals. A switching characteristic of each of the inverters included in one of the plurality of oscillators is different from a switching characteristic of each of the inverters included in another of the plurality of oscillators. The control circuit detects a process corner of the semiconductor device based on the plurality of oscillation signals to generate a control signal. The drive signal generation circuit generates a drive signal of a semiconductor device based on the control signal.

18 Claims, 16 Drawing Sheets

(56) References Cited

U.S. PATENT DOCUMENTS

| | | | | |
|---|---|---|---|---|
| 8,552,795 | B2 * | 10/2013 | Chi | G05F 3/205 327/543 |
| 8,816,754 | B1 * | 8/2014 | Clark | H03K 17/145 327/534 |
| 9,425,772 | B2 * | 8/2016 | Poppe | G01R 31/2853 |
| 10,361,692 | B2 | 7/2019 | Jeong et al. | |
| 10,659,014 | B2 * | 5/2020 | Kim | H03K 19/00369 |
| 10,943,053 | B2 | 3/2021 | Höppner et al. | |
| 10,972,080 | B2 | 4/2021 | Kim et al. | |
| 11,764,762 | B1 * | 9/2023 | Xiong | H03K 19/0944 331/57 |
| 12,273,113 | B2 * | 4/2025 | Lee | G11C 11/4093 |
| 2016/0225725 | A1 * | 8/2016 | Kim | G06K 7/10257 |
| 2018/0034452 | A1 * | 2/2018 | Lu | H03K 5/1565 |
| 2018/0059975 | A1 * | 3/2018 | Samson | G06F 1/324 |

FOREIGN PATENT DOCUMENTS

| | | | |
|---|---|---|---|
| KR | 1477052 | B1 | 12/2014 |
| KR | 2376653 | B1 | 3/2022 |

* cited by examiner

FIG. 1

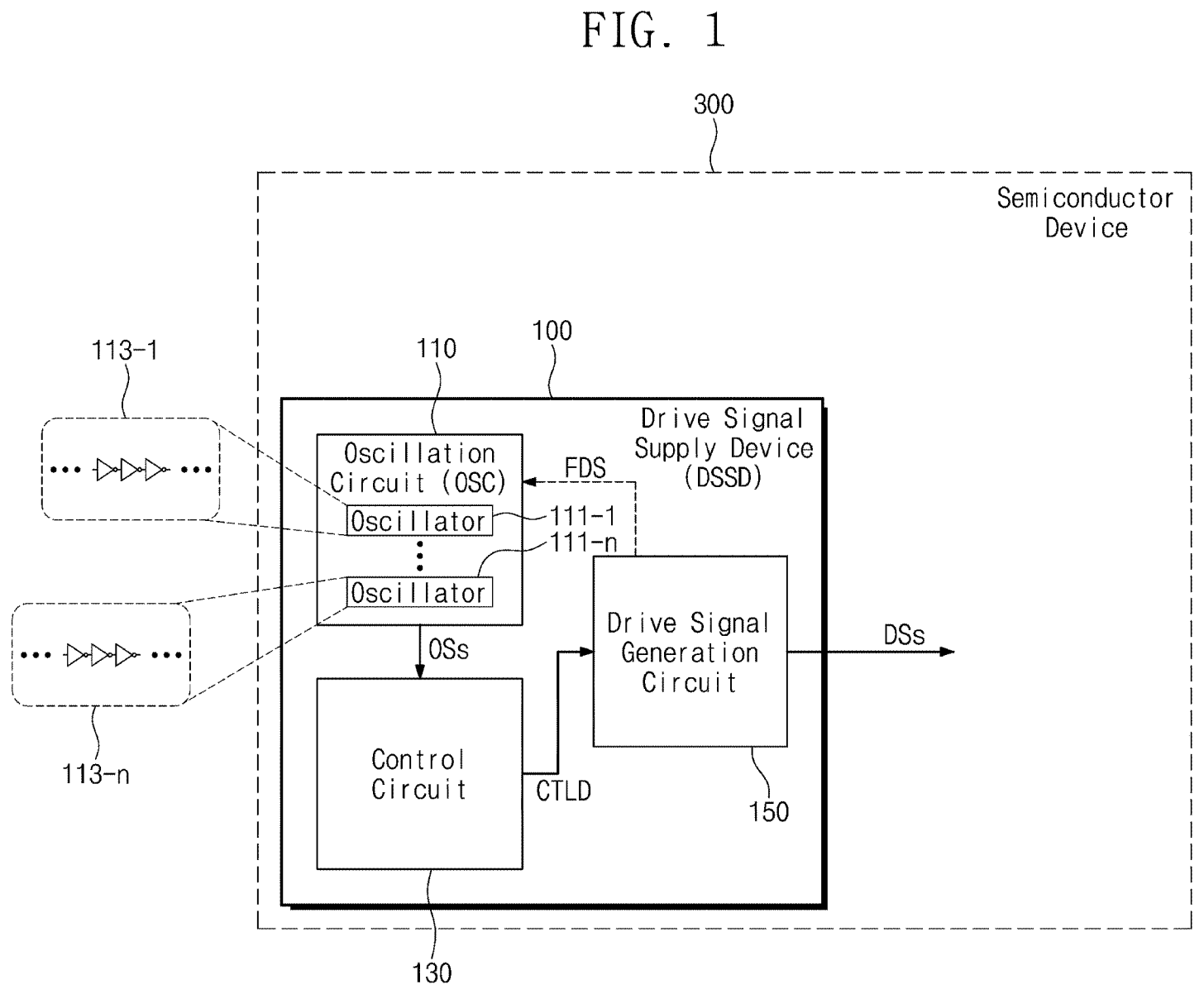

300
Semiconductor Device
100
Drive Signal Supply Device (DSSD)
110
Oscillation Circuit (OSC)
Oscillator
Oscillator
111-1
111-n
FDS
OSs
130
Control Circuit
CTLD
150
Drive Signal Generation Circuit
DSs
113-1
113-n

FF, TF, FT

REF2

TT, SF, FS

REF1

SS, TS, ST

DRIVE SIGNAL SUPPLY DEVICE AND DRIVE SIGNAL CALIBRATING METHOD THEREOF

CROSS-REFERENCE TO RELATED APPLICATIONS

This patent application claims priority under 35 U.S.C. § 119 to Korean Patent Application No. 10-2023-0102163 filed on Aug. 4, 2023, in the Korean Intellectual Property Office, the disclosure of which is incorporated by reference in its entirety herein.

1. TECHNICAL FIELD

Embodiments of the present disclosure described herein are directed to a semiconductor device, and more particularly directed to a drive signal supply device and a drive signal calibrating method thereof.

2. DISCUSSION OF RELATED ART

A semiconductor device is an electronic component that relies on the unique electrical properties of a semiconductor material for its functions. Examples of semiconductor devices include memory devices, power management devices, and sensor devices.

A semiconductor device may include a drive signal supply device and may operate based on drive signals generated by the drive signal supply device. The drive signal may be an internal voltage or an internal clock signal, which are supplied to one or more components included in the semiconductor device.

The semiconductor device may be manufactured in compliance with defined hardware specifications. However, due to process, voltage, and temperature (PVT) variations, the semiconductor device may not be manufactured properly or does not operate in compliance with the hardware specifications, as expected. Accordingly, the performance of the semiconductor device may deteriorate. For example, a voltage level of the internal voltage may fail to reach the voltage level defined by the hardware specifications or may exceed the voltage level defined by the hardware specifications, or the internal clock signal may fail to maintain its intended duty ratio.

SUMMARY

Embodiments of the present disclosure provide a drive signal supply device supplying a drive signal for an electronic device that satisfies a performance condition of hardware specifications for the electronic device.

Embodiments of the present disclosure provide a method of calibrating a drive signal of the drive signal supply device.

According to an embodiment, a drive signal supply device includes an oscillation circuit, a drive signal generation circuit, and a control circuit. The oscillation circuit outputs a plurality of oscillation signals. The oscillation circuit includes a plurality of oscillators, and each of the plurality of oscillators includes inverters. A switching characteristic of each of the inverters included in one of the plurality of oscillators is different from a switching characteristic of each of the inverters included in another of the plurality of oscillators. The control circuit detects a process corner of the semiconductor device based on the plurality of oscillation signals to generate a control signal. The drive signal generation circuit generates a drive signal of a semiconductor device based on the control signal.

According to an embodiment, in a method of calibrating a drive signal, a plurality of oscillation signals are output by an oscillation circuit. The oscillation circuit includes a plurality of oscillators, and each of the plurality of oscillators includes inverters. A switching characteristic of each of the inverters included in one of the plurality of oscillators is different from a switching characteristic of each of the inverters included in another of the plurality of oscillators. A process corner of a semiconductor device is detected based on the plurality of oscillation signals. A drive signal of the semiconductor device is calibrated based on the process corner.

According to an embodiment, a drive signal supply device includes an oscillation circuit, a drive signal generation circuit, and a control circuit. The oscillation circuit outputs a plurality of oscillation signals. The oscillation circuit includes a plurality of oscillators, and each of the plurality of oscillators includes inverters. A switching characteristic of each of the inverters included in one of the plurality of oscillators is different from a switching characteristic of each of the inverters included in another of the plurality of oscillators. The control circuit performs a comparison operation based on the plurality of oscillation signals to generate a control signal. The drive signal generation circuit generates a drive signal of a semiconductor device based on the control signal.

BRIEF DESCRIPTION OF THE FIGURES

The above and other objects and features of the present disclosure will become apparent by describing in detail embodiments thereof with reference to the accompanying drawings.

FIG. 1 is a block diagram illustrating a drive signal supply device according to an embodiment of the present disclosure.

DETAILED DESCRIPTION

Figure 2:
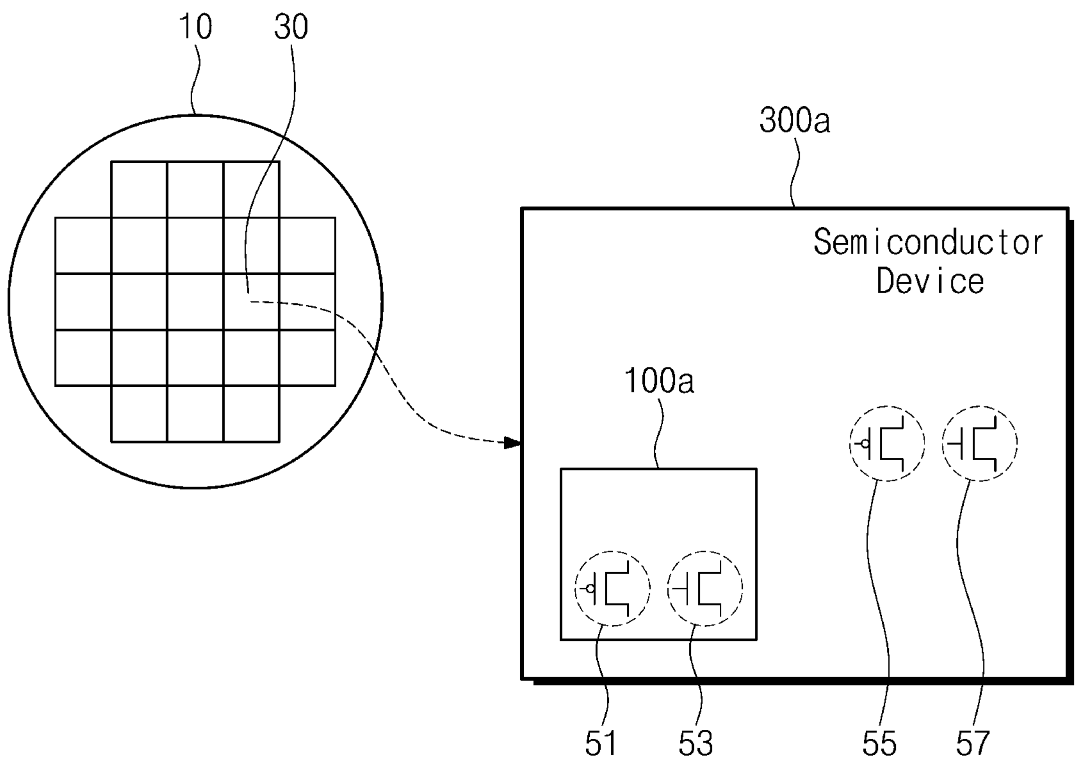
FIG. 2 is a diagram for describing a process change in the process of manufacturing a semiconductor device including the drive signal supply device of FIG. 1.

Below, embodiments of the present disclosure will be described in detail and clearly to such an extent that one skilled in the art may carry out the present disclosure.

FIG. 1 is a block diagram illustrating a drive signal supply device according to an embodiment of the present disclosure.

Referring to FIG. 1, a drive signal supply device (DSSD) 100 may be included in a semiconductor device 300. The drive signal supply device 100 may generate one or more drive signals DSs so as to be supplied to one or more components included in the semiconductor device 300. For example, the one or more drive signals DSs may be an internal voltage or an internal clock signal, but the present disclosure is not limited thereto.

The drive signal supply device 100 may include an oscillation circuit (OSC) 110, a control circuit 130, and a drive signal generation circuit 150.

The oscillation circuit 110 may output a plurality of oscillation signals OSs having different oscillation periods or different oscillation frequencies. For example, the oscillation circuit 110 may include a plurality of oscillators 111-1 and 111-*n* (n being 2 or more), and the oscillation circuit 110 may output the plurality of oscillation signals OSs by using the plurality of oscillators 111-1 and 111-*n*.

In an embodiment, each of the plurality of oscillators 111-1 and 111-*n* include inverters, and a switching characteristic of each inverter (e.g., 113-1) included in one of the plurality of oscillators 111-1 and 111-*n* may be different from a switching characteristic of each inverter (e.g., 113-*n*) included in another (or the other) of the plurality of oscillators 111-1 and 111-*n*. For example, each of the plurality of oscillators may be implemented with a ring oscillator. Inverters included in each ring oscillator may have the same switching characteristic, but the inverters included in one ring oscillator and the inverters included in another (or the other) of the plurality of ring oscillators may have different switching characteristics. For example, a first ring oscillator included in the plurality of oscillators 111-1 and 111-*n* may only include inverters having a first switching characteristic, and a second ring oscillator included in the plurality of oscillators 111-1 and 111-*n* may only include inverters having a second switching characteristic different from the first switching characteristic.

In an embodiment, each inverter included in each of the plurality of oscillators 111-1 and 111-*n* includes a p-type metal oxide semiconductor (PMOS) transistor and an N-type metal oxide semiconductor (NMOS) transistor, and according to the hardware specifications of each of the PMOS transistor and the NMOS transistor included in each inverter, the inverters may have the above switching characteristics.

In an embodiment, for the plurality of oscillators 111-1 and 111-*n* to output the plurality of oscillation signals OSs having different oscillation periods or different oscillation frequencies, the hardware specifications of the PMOS transistor and the NMOS transistor included in each inverter may be defined independently, regardless of a plurality of PMOS transistors and a plurality of NMOS transistors, which are included in the semiconductor device 300 but are not included in the drive signal supply device 100. The hardware specifications of each of the PMOS transistor and the NMOS transistor included in each inverter may be for calibrating the one or more drive signals DSs in the process where the drive signal supply device 100 generates the one or more drive signals DSs. The oscillation circuit 110 will be described with reference to FIGS. 4A and 4B.

The control circuit 130 may receive the plurality of oscillation signals OSs from the oscillation circuit 110. In an embodiment, the control circuit 130 is configured to detect a process characteristic of the semiconductor device 300, which may depend on the manufacturing process used to manufacture the semiconductor device 300, based on the plurality of oscillation signals OSs and may generate a control signal CTLD based on the detected process characteristic.

In an embodiment, the control circuit 130 may detect a process corner of the semiconductor device 300 from the plurality of oscillation signals OSs and may generate the control signal CTLD based on the process corner. The process corner may be an index for identifying a process characteristic by classifying process distributions, which indicate process variations of the semiconductor device 300 according to the manufacturing process, based on a given criterion. A detection of the process corner may mean detecting a type of the process corner or estimating a type of the process corner and may include determining or identifying the process corner. The control circuit 130 will be described with reference to FIGS. 5, 6, and 11.

The drive signal generation circuit 150 may generate the one or more drive signals DSs of the semiconductor device 300 based on the control signal CTLD.

In an embodiment, the control circuit 130 controls operations of the drive signal generation circuit 150 by using the control signal CTLD. For example, the control circuit 130 may calibrate the one or more drive signals DSs by using the control signal CTLD. For example, the drive signal generation circuit 150 may adjust voltage level(s) or duty ratio(s) of the one or more drive signals DSs of the semiconductor device 300 based on the control signal CTLD and may generate and output the one or more drive signals DSs whose voltage level or duty ratio is adjusted.

In an embodiment, the drive signal generation circuit 150 provides the oscillation circuit 110 with the one or more drive signals DSs as a feedback signal FDS, and the oscillation circuit 110 may again output the plurality of oscillation signals OSs. For example, the oscillation circuit 110 may modify one of the oscillation signals OSs based on the feedback signal FDS. The drive signal generation circuit 150 will be described with reference to FIGS. 10 and 14.

Through the above configuration, a drive signal supply device according to an embodiment of the present disclosure may detect a process corner as a process characteristic of a semiconductor device by using a plurality of oscillators outputting a plurality of oscillation signals having different oscillation periods or different oscillation frequencies and may generate and calibrate one or more drive signals to be supplied to each component included in the semiconductor device based on the process corner.

One or more drive signals satisfying a performance condition of the hardware specifications may be supplied to the semiconductor device through the drive signal supply device regardless of the PVT variations. Accordingly, the performance of the semiconductor device may be prevented from deteriorating.

FIG. 2 is a diagram for describing a process change in the process of manufacturing a semiconductor device including a drive signal supply device of FIG. 1.

Referring to FIG. 2, in the process of manufacturing a semiconductor device, a plurality of chips (or dies) including a plurality of semiconductor devices may be formed in one wafer 10. An example in which a semiconductor device 300*a* is formed in one chip (e.g., 30) is illustrated in FIG. 2, and the semiconductor device 300*a* may include a drive signal supply device 100*a*. The semiconductor device 300*a* and the drive signal supply device 100*a* may respectively correspond to the semiconductor device 300 and the drive signal supply device 100 of FIG. 1.

A PMOS transistor 51 and an NMOS transistor 53 included in the drive signal supply device (DSSD) 100*a* may correspond to transistors included in inverters of each of a plurality of oscillators (e.g., 111-1 and 111-*n* of FIG. 1). A PMOS transistor 55 and an NMOS transistor 57 that are included in the semiconductor device 300*a* and are formed outside the drive signal supply device 100*a* may correspond to a plurality of PMOS transistors and a plurality of NMOS transistors that are included in the semiconductor device 300*a* but are not included in the drive signal supply device 100*a*.

In an embodiment, process variations may be present in the transistors 51, 53, 55, and 57 of the semiconductor device 300*a* manufactured during a manufacturing process. The transistors 51 and 53 may be manufactured such that the inverters included in each of the plurality of oscillators 111-1 and 111-*n* have a specific switching characteristic, as described above, regardless of the process variations. However, when the transistors are manufactured through the same manufacturing process, the plurality of oscillators 111-1 and 111-*n* may output a plurality of oscillation signals that are affected by the process variations.

In an embodiment, the process corner described with reference to FIG. 1 may relate to the transistors 55 and 57 included in the semiconductor device 300*a*. For example, a detection or estimation of the process corner may be performed with respect to the transistors 55 and 57, and voltage level(s) or duty ratio(s) of one or more drive signals to be supplied to the semiconductor device 300*a* may be calibrated (or adjusted) based on the process corner.

The semiconductor device 300*a* formed in one chip and the drive signal supply device 100*a* included in the semiconductor device 300*a* are described with reference to FIG. 2, but the remaining chips formed in the wafer 10 may be implemented in the same manner or in similar manners. Accordingly, a drive signal supply device for a semiconductor device included in each of a plurality of chips formed in the wafer 10 may be implemented for each chip.

Figure 3:
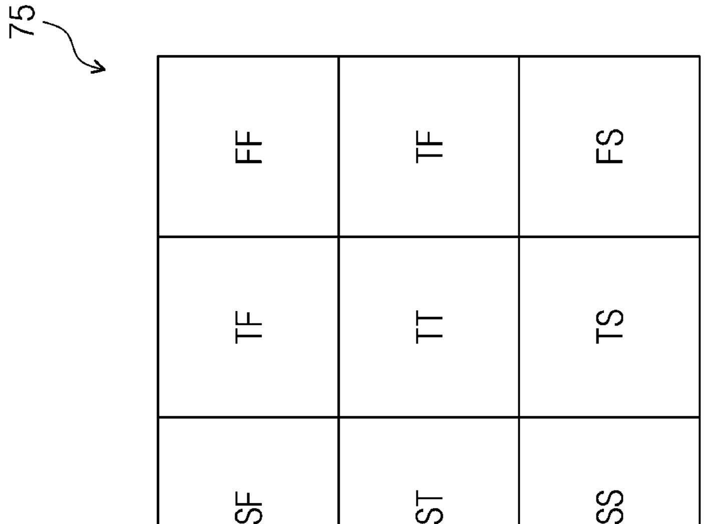
FIG. 3 is a diagram for describing process distributions indicating process variations of FIG. 2 and a process corner of FIG. 2.
Figure 3:
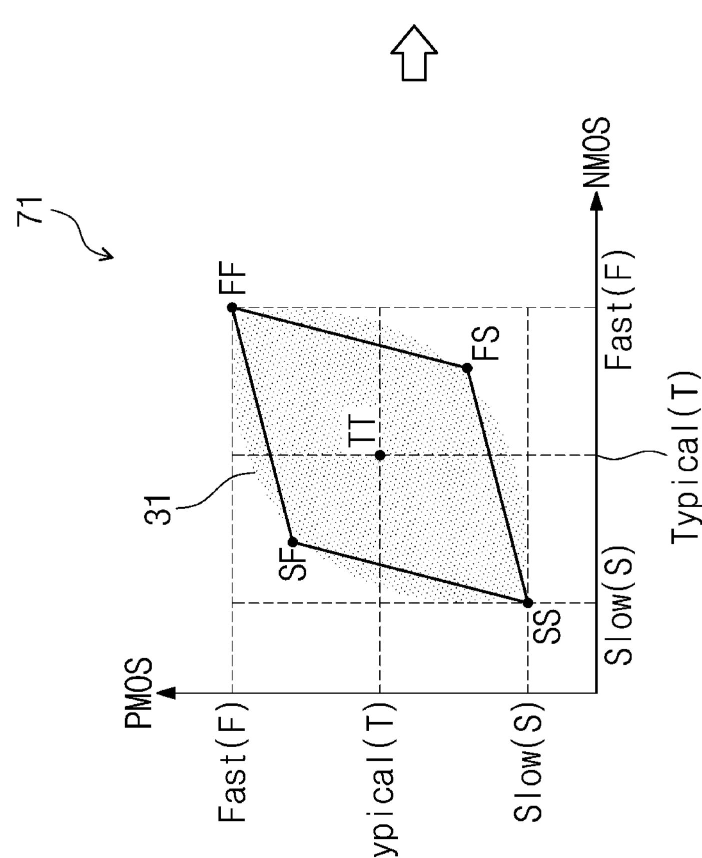

FIG. 3 is a diagram for describing process distributions indicating process variations of FIG. 2 and a process corner of FIG. 2.

In FIG. 3, reference numeral 71 indicates a graph of process distributions 31. In FIG. 3, a horizontal axis represents a speed of an NMOS transistor (or a magnitude of a drain current in a saturation mode of the NMOS transistor), and a vertical axis represents a speed of a PMOS transistor (or a magnitude of a drain current in a saturation mode of the PMOS transistor).

In association with the performance condition of the hardware specifications of the semiconductor device, a process corner may be expressed by 1) "Fast (F)" when the NMOS transistor is manufactured such that a speed of the NMOS transistor is fast compared to the defined speed range, 2) "Slow (S)" when the NMOS transistor is manufactured such that a speed of the NMOS transistor is slow compared to the defined speed range, and 3) "Typical (T)" when the NMOS transistor is manufactured such that a speed of the NMOS transistor satisfies the defined speed range. A speed of a PMOS transistor may be expressed in the same manner as the NMOS transistor.

In association with the performance condition of the hardware specifications of the semiconductor device, a process corner may be expressed by "Slow-Fast (SF)" when the NMOS transistor is manufactured such that a speed of the NMOS transistor is slow compared to the defined speed range and when the PMOS transistor is manufactured such that a speed of the PMOS transistor is fast compared to the defined speed range. In association with the performance condition, a process corner may be expressed by "Fast-Slow (FS)" when the NMOS transistor is manufactured such that a speed of the NMOS transistor is fast compared to the defined speed range and when the PMOS transistor is manufactured such that a speed of the PMOS transistor is slow compared to the defined speed range. As in the above description, process corners "FF", "TT", and "SS" may be defined. For example, the process corner may be expressed by a combination of two letters sequentially indicating a characteristic of an NMOS transistor and a characteristic of a PMOS transistor, which are determined depending on the manufacturing process.

In FIG. 3, reference numeral 75 indicates a table of the process corners "SF" (e.g., "Slow-Fast"), "TF" (e.g., "Typical-Fast"), "FF" (e.g., Fast-Fast), "ST" (e.g., "Slow-Typical"), "TT" (e.g., "Typical-Typical"), "FT" (e.g., "Fast-Typical"), "SS" (e.g., "Slow-Slow"), "TS" (e.g., "Typical-Slow", and "FS" e.g., ("Fast-Slow"). Each of the processor corners may be represented by a unique index number.

Figure 4A:
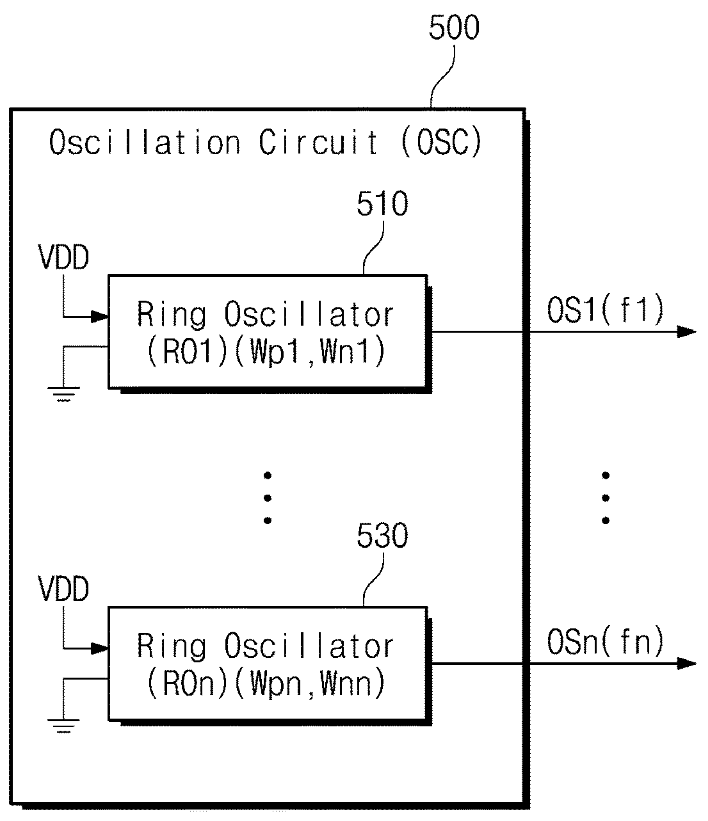
FIG. 4A is a block diagram illustrating an embodiment of an oscillation circuit of FIG. 1.
Figure 4B:
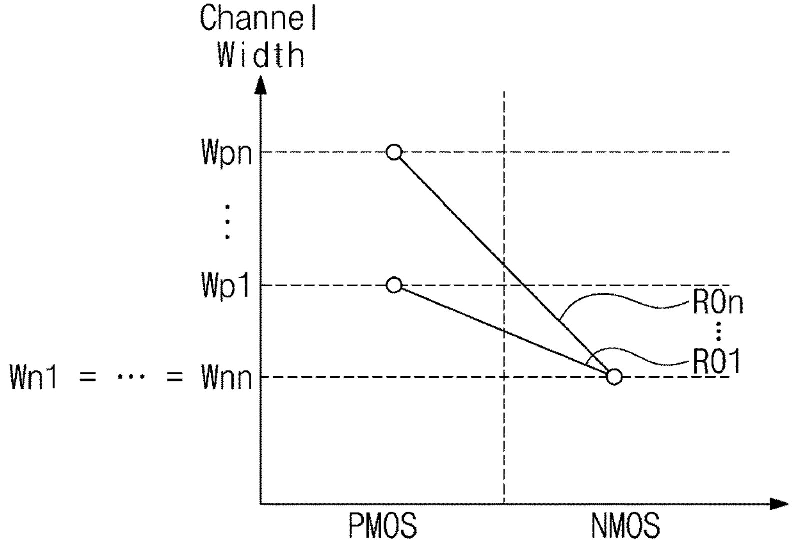
FIG. 4B is a diagram for describing switching characteristics of oscillators of FIG. 4A.

FIG. 4A is a block diagram illustrating an embodiment of an oscillation circuit of FIG. 1 and FIG. 4B is a diagram for describing switching characteristics of oscillators of FIG. 4A.

Referring to FIG. 4A, an oscillation circuit (OSC) 500 may output a plurality of oscillation signals having different oscillation periods or different oscillation frequencies. For example, the oscillation circuit 500 may include a plurality of ring oscillators (RO1 and ROn) (n being 2 or more) 510 and 530, and the plurality of ring oscillators RO1 and ROn may output a plurality of oscillation signals OS1 and OSn having different oscillation frequencies (e.g., f1 and fn).

In an embodiment, each of the plurality of ring oscillators 510 and 530 include inverters, and a switching characteristic of each inverter included in one of the plurality of ring oscillators 510 and 530 may be different from a switching characteristic of each inverter included in another (or the other) of the plurality of ring oscillators 510 and 530.

In an embodiment, each inverter included in each of the plurality of ring oscillators 510 and 530 includes a PMOS transistor and an NMOS transistor connected in series between a power supply voltage VDD and a ground voltage. According to the hardware specifications of each of the PMOS transistor and the NMOS transistor included in each inverter, the inverters may have the switching characteristics. For example, the PMOS transistor and the NMOS transistor included in the ring oscillator 510 may be defined to have channel widths Wp1 and Wn1, respectively. For example, the PMOS transistor and the NMOS transistor included in the ring oscillator 530 may be defined to have channel widths Wpn and Wnn, respectively.

Referring to FIGS. 4A and 4B, the switching characteristic of the inverters may mean a relationship between a change of an input signal and a change of an output signal over time and may be distinguished from a direct current (DC) characteristic meaning a relationship between a change of an input signal and a change of an output signal without consideration of the lapse of time.

An oscillation frequency of a ring oscillator may be determined based on a logical effort, an electrical effort, a parasitic delay, or the number of inverters included in a ring oscillator. The logical effort may be defined by a ratio of an input capacitance of a given gate and an input capacitance of an inverter capable of transferring the same output current. For example, the channel widths Wn1 and Wnn of the NMOS transistors included in the ring oscillators 510 and 530 may be determined to have the same value. The channel width Wpn of the PMOS transistor included in the ring oscillator 530 may be determined to be larger than the channel width Wnn of the PMOS transistor included in the ring oscillator 510. According to the above scheme, the ring oscillators 510 and 530 may be implemented to have different logical efforts, and the ring oscillators 510 and 530 may output a plurality of oscillation signals having different oscillation periods or different oscillation frequencies.

In an embodiment, a ratio of channel widths may be defined for each inverter included in each ring oscillator. In each inverter included in each ring oscillator, the ratio of channel widths may be defined as a ratio of a channel width of a PMOS transistor and a channel width of an NMOS transistor. For example, each inverter included in the ring oscillator (RO1) 510 may have a ratio of channel widths: Wp1/Wn1. Each inverter included in the ring oscillator (ROn) 530 may have a ratio of channel widths: Wpn/Wnn. For example, the ratio of channel widths of each inverter included in the ring oscillator (ROn) 530 may be greater than the ratio of channel widths of each inverter included in the ring oscillator (RO1) 510.

In an embodiment, the number of ring oscillators included in the oscillation circuit 500 may be determined depending on a type of a drive signal. For example, when the drive signal is the internal voltage, the number of ring oscillators included in the oscillation circuit 500 may be 2 or more. For example, when the drive signal is the internal clock signal, the number of ring oscillators included in the oscillation circuit 500 may be 3 or more. However, the present disclosure is not limited thereto.

Figure 5:
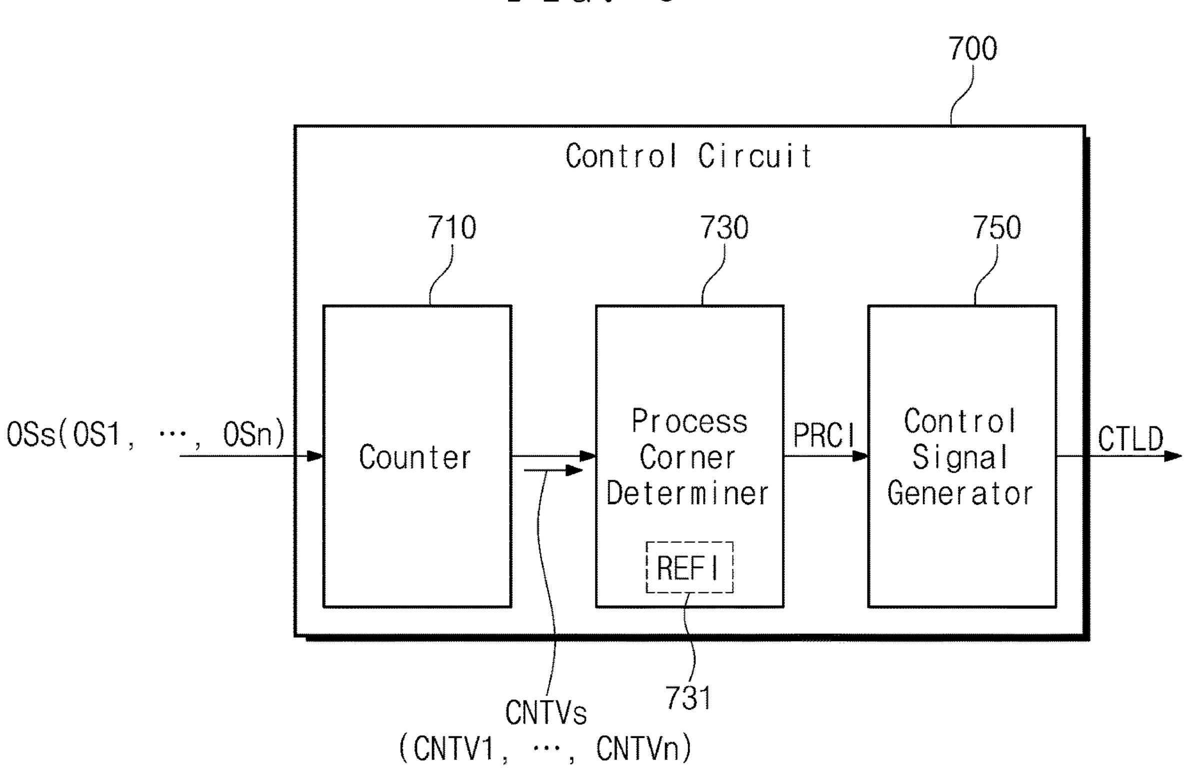
FIG. 5 is a block diagram illustrating an embodiment of a control circuit of FIG. 1.

FIG. 5 is a block diagram illustrating an embodiment of the control circuit of FIG. 1.

Referring to FIGS. 1 and 5, a control circuit 700 may correspond to the control circuit 130. In an embodiment, the control circuit 700 receives the plurality of oscillation signals OSs (OS1, . . . , OSn), detects a process corner of a semiconductor device based on the plurality of oscillation signals OSs, and generates the control signal CTLD based on the process corner.

The control circuit 700 may include a counter 710 (e.g., a counter circuit), a process corner determiner 730 (e.g., a logic circuit), and a control signal generator 750.

The counter 710 may count the plurality of oscillation signals OSs to generate a plurality of count values CNTVs (CNTV1, . . . , CNTVn). For example, the counter 710 may count the rising edge or falling edge of each of the plurality of oscillation signals OSs. For example, the counter 710 may count the oscillation signal OS1 to generate the count value CNTV1 and may count the oscillation signal OSn to generate the count value CNTVn.

In an embodiment, the process corner determiner 730 determines the process corner based on the plurality of count values CNTVs. In an embodiment, the process corner determiner 730 generates and output process corner information PRCI including information about the process corner.

The control signal generator 750 receives the process corner information PRCI and generates the control signal CTLD based on the process corner information PRCI.

In an embodiment, the process corner determiner 730 stores reference value information (REFI) 731 including two or more reference voltages or two or more reference values for classifying (or distinguishing) types of the process corner. The reference value information 731 may be stored in the process corner determiner 730 in advance before a drive signal supply device according to an embodiment of the present disclosure operates.

In an embodiment, depending on a type of a drive signal that a drive signal supply device (e.g., 100 of FIG. 1) generates or calibrates, the two or more reference values may be used or may not be used in the process of determining the process corner. When the drive signal supply device generates or calibrates the internal voltage, the two or more reference values may be used. When the drive signal supply device generates or calibrates the internal clock signal, the two or more reference values need not be used.

In an embodiment, the process corner determiner 730 may be differently implemented depending on the case where the drive signal supply device generates or calibrates the internal voltage and the case where the drive signal supply device generates or calibrates the internal clock signal and may classify (or distinguish) types of the process corner in different manners. The case of generating or calibrating the internal voltage will be described with reference to FIGS. 6 to 10, and the case of generating or calibrating the internal voltage will be described with reference to FIGS. 11 to 14.

Figure 6:
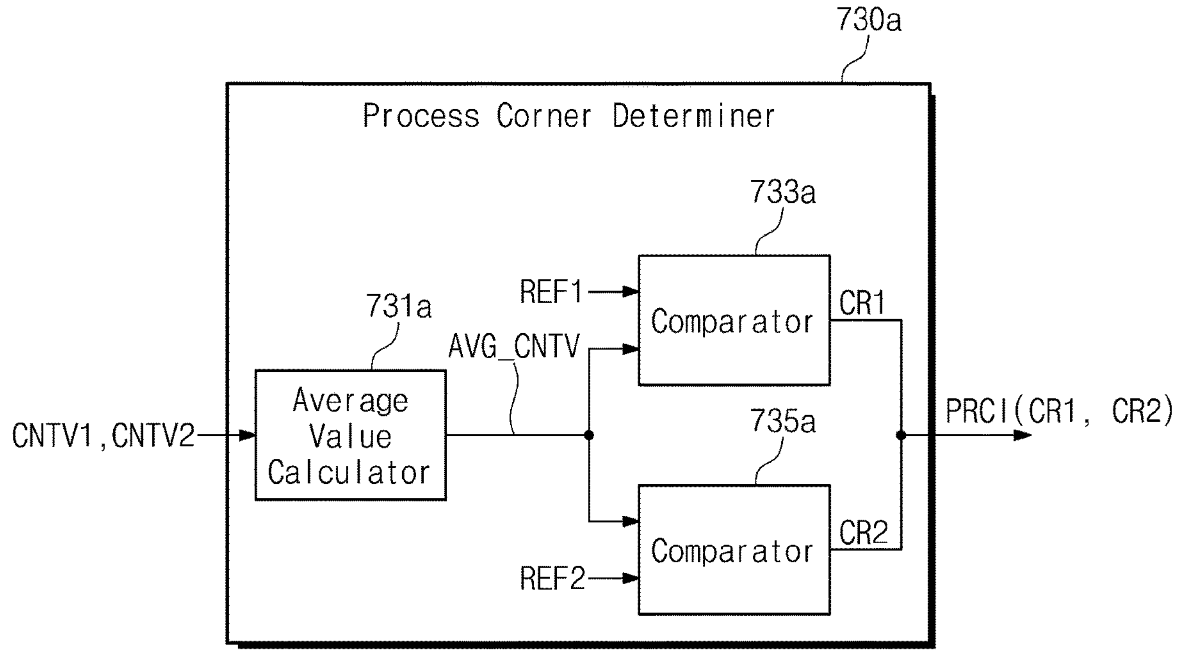
FIG. 6 is a block diagram illustrating an embodiment of a process corner determiner of FIG. 5.

FIG. 6 is a block diagram illustrating an embodiment of a process corner determiner of FIG. 5.

Referring to FIGS. 5 and 6, a process corner determiner 730*a* may correspond to the process corner determiner 730. The process corner determiner 730*a* may be used to generate or calibrate the internal voltage as a drive signal to be supplied to a semiconductor device.

The process corner determiner 730*a* may determine the process corner based on two or more reference values REF1 and REF2 for classifying (or distinguishing) types of the process corner and a plurality of count values CNTV1 and CNTV2. In this case, an oscillation circuit (e.g., 500 of FIG. 4A) may include two oscillators (or two ring oscillators) and may generate oscillation signals OS1 and OS2 (i.e., when n is 2 in FIG. 4A or 5). The plurality of count values CNTV1 and CNTV2 may be generated by counting the oscillation signals OS1 and OS2, respectively. While, the number of oscillators included in the oscillation circuit is two in this example, embodiments of the disclosure are not limited thereto. As described with reference to FIGS. 4A and 4B, the ratio of channel widths of each inverter included in a ring oscillator outputting the oscillation signal OS2 may be greater than the ratio of channel widths of each inverter included in a ring oscillator outputting the oscillation signal OS1.

The process corner determiner 730*a* may include an average value calculator 731*a* (e.g., a logic circuit) and comparators 733*a* and 735*a* (e.g., a comparator circuits).

The average value calculator 731*a* may receive the plurality of count values CNTV1 and CNTV2 and may calculate an average count value AVG_CNTV by averaging the plurality of count values CNTV1 and CNTV2.

In an embodiment, the comparators 733*a* and 735*a* compare the average count value AVG_CNTV with the two or more reference values REF1 and REF2 for determining the process corner. In an embodiment, the comparator 733*a* compares the average count value AVG_CNTV and the reference value REF1 to generate a comparison result CR1, and the comparator 735*a* compares the average count value AVG_CNTV and the reference value REF2 to generate a comparison result CR2.

The process corner determiner 730*a* may determine a type of the process corner based on the comparison results CR1 and CR2. The process of determining a type of the process corner will be described with reference to FIG. 7. The process corner determiner 730*a* may generate and output the process corner information PRCI including information about the process corner. For example, the process corner determiner 730*a* may generate the process corner information PRCI based on the comparison results CR1 and CR2 (or may output the comparison results CR1 and CR2 as the process corner information PRCI).

Figure 7:
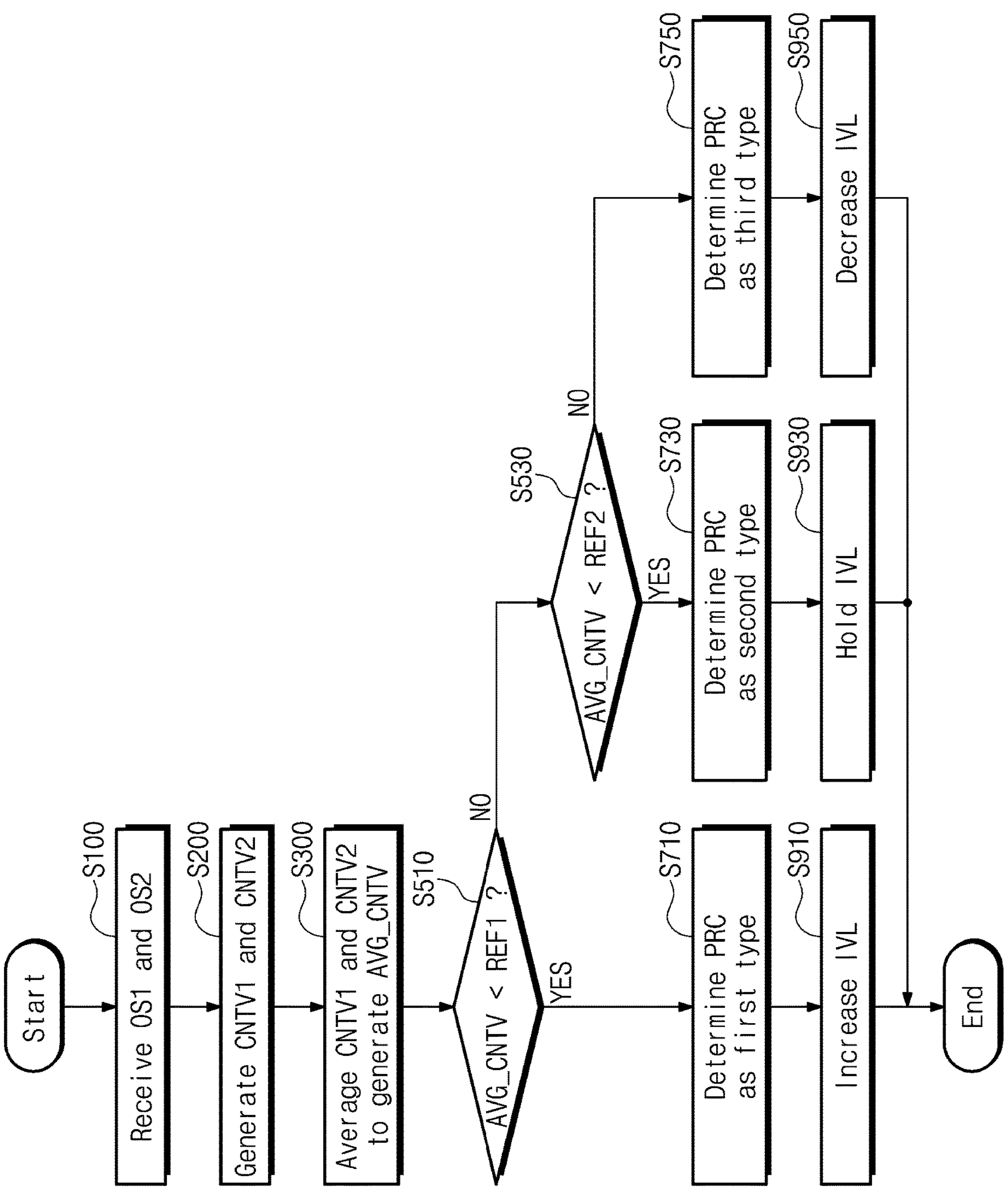
FIG. 7 is a flowchart illustrating an embodiment in which a control circuit of FIG. 5 including a process corner determiner of FIG. 6 operates.

FIG. 7 is a flowchart illustrating an embodiment in which a control circuit of FIG. 5 including a process corner determiner of FIG. 6 operates.

Referring to FIGS. 5 to 7, the control circuit 700 receives the plurality of oscillation signals OS1 and OS2 (S100).

The counter 710 counts the plurality of oscillation signals OS1 and OS2 to generate the plurality of count values CNTV1 and CNTV2 (S200).

The process corner determiner 730*a* averages the plurality of count values CNTV1 and CNTV2 to generate the average count value AVG_CNTV (S300).

The process corner determiner 730*a* determines whether the average count value AVG_CNTV is smaller than the reference value REF1 (S510). If the average count value AVG_CNTV is not smaller than the reference value REF1, the process corner determiner 730*a* determines whether the average count value AVG_CNTV is smaller than the reference value REF2 (S530). The process corner determiner 730*a* may classify types of a process corner depending on determination results in operation S510 and operation S530. As will be described with reference to FIG. 12, the process corner determiner 730*a* may classify types of a process corner in a manner different from that of a process corner determiner 730*b*. For example, first to third types of a process corner that are classified by the process corner determiner 730*a* may be different from fourth to sixth types of a process corner that are classified by the process corner determiner 730*b*.

When the average count value AVG_CNTV is smaller than the reference value REF1 (YES in operation S510), the process corner determiner 730*a* determines that the process corner has the first type (S710). The control signal generator 750 increases a voltage level IVL of the internal voltage upon determining that the process corner has the first type (S910). In an embodiment, the first type corresponds to a case where transistors of a semiconductor device are manufactured such that a speed of the transistors is slow compared to the defined speed range, in association with the performance condition of the hardware specifications of the semiconductor device.

When the average count value AVG_CNTV is greater than or equal to the reference value REF1 (NO in operation S510) and when the average count value AVG_CNTV is smaller than the reference value REF2 (YES in operation S530), the process corner determiner 730*a* determines that the process corner has the second type (S730). The control signal generator 750 holds or maintains the voltage level IVL of the internal voltage upon determining that the process corner has the second type (S930). The second type may correspond to the case where transistors of a semiconductor device are manufactured such that a speed of the transistors satisfies the defined speed range, in association with the performance condition of the hardware specifications of the semiconductor device.

When the average count value AVG_CNTV is greater than or equal to the reference value REF1 (NO in operation S510) and when the average count value AVG_CNTV is greater than or equal than the reference value REF2 (NO in operation S530), the process corner determiner 730*a* determines that the process corner has the third type (S750). The control signal generator 750 decreases the voltage level IVL of the internal voltage upon determining that the process corner has the third type (S950). In an embodiment, the third type corresponds to a case where transistors of a semiconductor device are manufactured such that a speed of the transistors is fast compared to the defined speed range, in association with the performance condition of the hardware specifications of the semiconductor device. The first type, the second type, and the third type will be described with reference to FIG. 8. The reference values REF1 and REF2 will be described with reference to FIG. 9. While FIG. 7 illustrates S510 occurring before S530, in an alternate embodiment, S530 is executed first.

Figure 8:
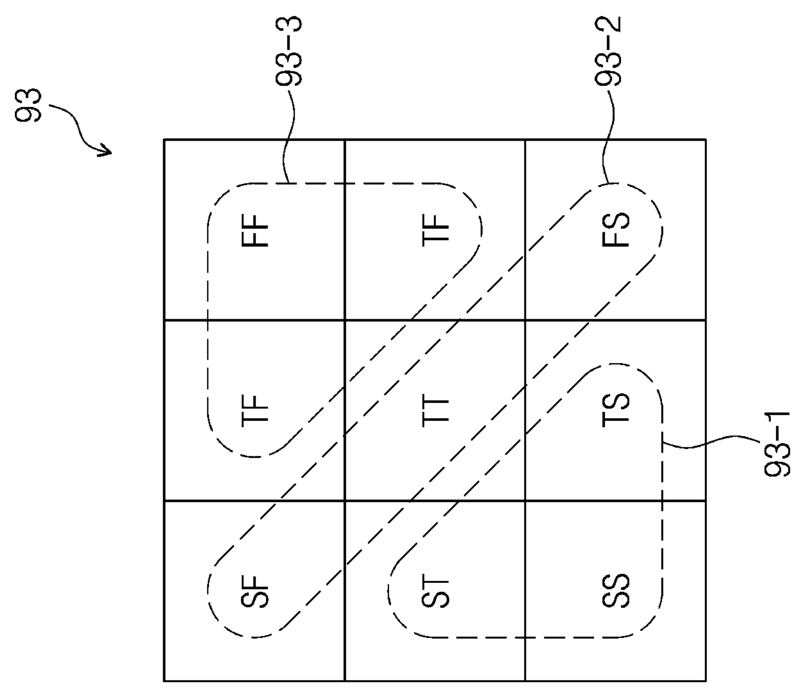
FIG. 8 is a diagram for describing a process corner determining process of FIG. 7 according to an embodiment of the present disclosure.
Figure 8:
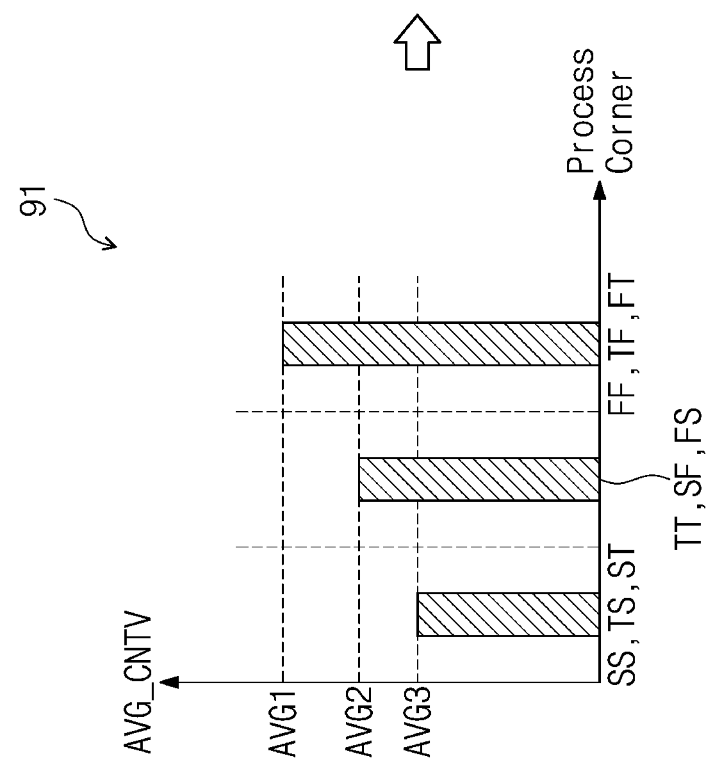

FIG. 8 is a diagram for describing a process corner determining process of FIG. 7 according to an embodiment.

In FIG. 8, reference numeral 91 indicates the average count values AVG_CNTV associated with the process corners "SF", "TF", "FF", "ST", "TT", "FT", "SS", "TS", and "FS", and reference numeral 93 indicates the first type, the second type, and the third type. The average count values AVG_CNTV indicated by reference numeral 91 of FIG. 8 may be data that are collected through a test operation performed in advance before a drive signal supply device according to an embodiment of the present disclosure operates. For example, a plurality of average count values AVG_CNTV may be collected from a plurality of test semiconductor devices that are manufactured to indicate various process corners "SF", "TF", "FF", "ST", "TT", "FT", "SS", "TS", and "FS" and each of which includes a drive signal supply device (e.g., 100 of FIG. 1).

In an embodiment, "AVG3" may mean the average count value AVG_CNTV collected from a test semiconductor device indicating the process corners "SS", "TS", and "ST". "AVG2" may mean the average count value AVG_CNTV collected from a test semiconductor device indicating the process corners "TT", "SF", and "FS". "AVG1" may mean the average count value AVG_CNTV collected from a test semiconductor device indicating the process corners "FF", "TF", and "FT". In an embodiment, AVG1 is greater than AVG2, and AVG2 is greater than AVG3.

In an embodiment, process corners corresponding to (or associated with) the same average count value AVG_CNTV or similar average count values AVG_CNTV may be classified as one type of a process corner. For example, referring to a box indicated by reference numeral 93 of FIG. 8, the process corners "SS", "TS", and "ST" corresponding to the average count value AVG_CNTV having AVG3 may be classified as a first type 93-1 of a process corner. The process corners "TT", "SF", and "FS" corresponding to the average count value AVG_CNTV having AVG2 may be classified as a second type 93-2 of a process corner. The process corners "FF", "TF", and "FT" corresponding to the average count value AVG_CNTV having AVG1 may be classified as a third type 93-3 of a process corner.

Figures 9, 10:
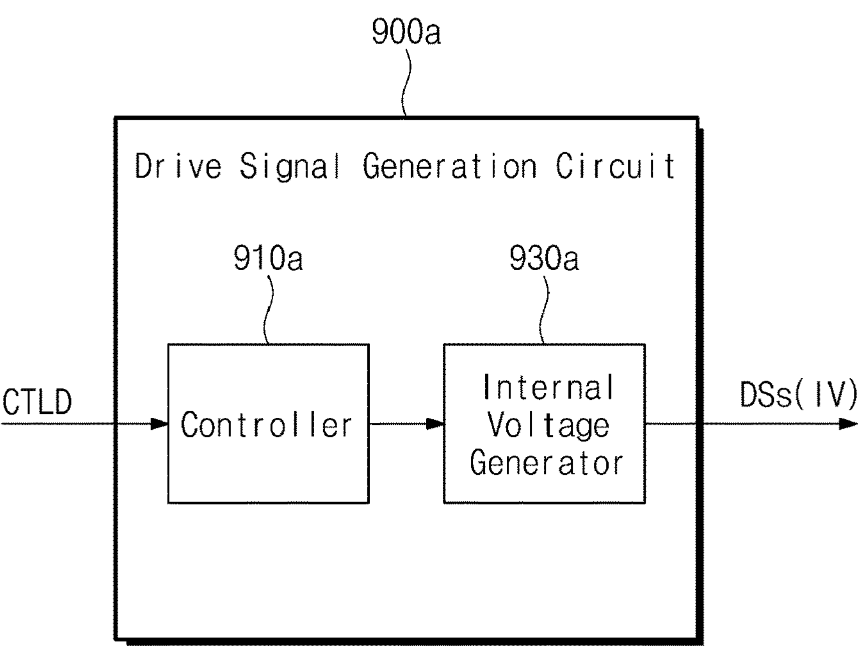
FIG. 9 is a diagram for describing two or more reference values of FIG. 7.
FIG. 10 is a block diagram illustrating an embodiment of the drive signal generation circuit of FIG. 1.

FIG. 9 is a diagram for describing two or more reference values of FIG. 7.

Referring to FIGS. 7 to 9, the reference values REF1 and REF2 may be set to classify the first type 93-1, the second type 93-2, and the third type 93-3 of the process corner.

In an embodiment, the reference value REF1 is used to classify the first type 93-1 and the second type 93-2 and is set to be smaller than AVG2 and greater than AVG3. The reference value REF2 is used to classify the third type 93-3 and the second type 93-2 and is set to be smaller than AVG1 and greater than AVG2.

As described with reference to FIG. 7, the process corner determiner 730 may determine whether the average count value AVG_CNTV is smaller than the reference value REF1 (S510) and may determine whether the average count value AVG_CNTV is smaller than the reference value REF2 (S530).

The process corner determiner 730 may determine a type of the process corner based on the determination results of operation S510 and operation S530, and the control signal generator 750 may increase, hold, or decrease the voltage level IVL of the internal voltage in operation S910, operation S930, or operation S950.

FIG. 10 is a block diagram illustrating an embodiment of a drive signal generation circuit of FIG. 1.

Referring to FIGS. 1 and 10, a drive signal generation circuit 900*a* may correspond to the drive signal generation circuit 150. The drive signal generation circuit 900*a* may receive the control signal CTLD from a control circuit (e.g., 700 of FIG. 5) including a process corner determiner (e.g., 730*a* of FIG. 6) and may generate or calibrate the one or more drive signals DSs including an internal voltage IV based on the control signal CTLD.

The drive signal generation circuit 900*a* may include a controller 910*a* (e.g., a control circuit) and an internal voltage generator 930*a*. The controller 910*a* may control the internal voltage generator 930*a* based on the control signal CTLD. The internal voltage generator 930*a* may generate or calibrate the one or more drive signals DSs including the internal voltage IV under control of the controller 910*a*.

In an embodiment, under control of the controller 910*a*, the internal voltage generator 930*a* may calibrate the voltage level of the internal voltage IV by increasing, holding, or decreasing the voltage level of the internal voltage IV in operation S910, operation S930, or operation S950.

Figure 11:
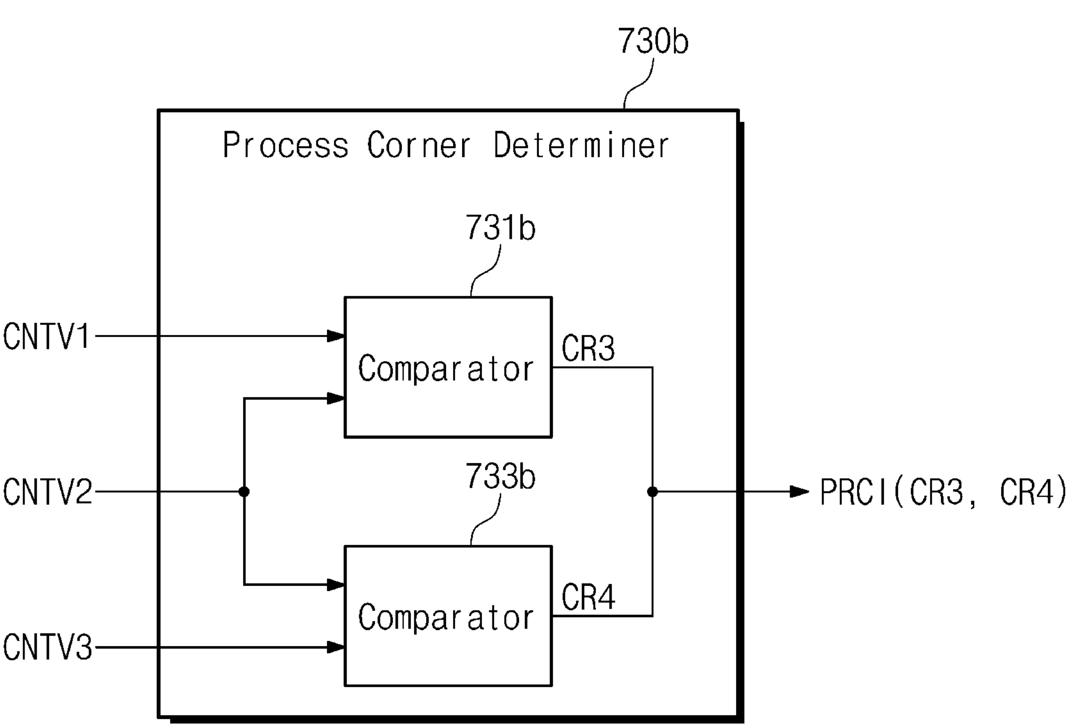
FIG. 11 is a block diagram illustrating an embodiment of a process corner determiner of FIG. 5.

FIG. 11 is a block diagram illustrating an embodiment of a process corner determiner of FIG. 5.

Referring to FIGS. 5 and 11, the process corner determiner 730*b* may correspond to the process corner determiner 730. The process corner determiner 730*b* may be used to generate or calibrate the internal clock signal as a drive signal to be supplied to a semiconductor device.

In an embodiment, the process corner determiner 730 determines the process corner based on the plurality of count values CNTV1, CNTV2, and CNTV3. In this case, an oscillation circuit (e.g., 500 of FIG. 4A) may include three oscillators (or three ring oscillators) and may generate oscillation signals OS1, OS2, and OS3 (i.e., when n is 3 in FIG. 4A or 5). The plurality of count values CNTV1, CNTV2, and CNTV3 may be generated by counting the oscillation signals OS1, OS2, and OS3, respectively. While, the number of oscillators included in the oscillation circuit is three in this example, embodiments of the disclosure are not limited thereto. As described with reference to FIGS. 4A and 4B, the ratio of channel widths of each inverter included in a ring oscillator outputting the oscillation signal OS3 may be greater than the ratio of channel widths of each inverter included in a ring oscillator outputting the oscillation signal OS2. The ratio of channel widths of each inverter included in the ring oscillator outputting the oscillation signal OS2 may be greater than the ratio of channel widths of each inverter included in a ring oscillator outputting the oscillation signal OS1.

The process corner determiner 730*b* may include comparators 731*b* and 733*b*.

The comparators 731*b* and 733*b* may compare the plurality of count values CNTV1, CNTV2, and CNTV3 for determining the process corner. In an embodiment, the comparator 731*b* compares the count values CNTV1 and CNTV2 to generate a comparison result CR3, and the comparator 733*b* compares the count values CNTV2 and CNTV3 to generate a comparison result CR4.

The process corner determiner 730*b* may determine a type of the process corner based on the comparison results CR3 and CR4. The process of determining a type of the process corner will be described with reference to FIG. 12. The process corner determiner 730*b* may generate and output the process corner information PRCI including information about the process corner. For example, the process corner determiner 730*b* may generate the process corner information PRCI based on the comparison results CR3 and CR4 (or may output the comparison results CR3 and CR4 as the process corner information PRCI).

Figure 12:
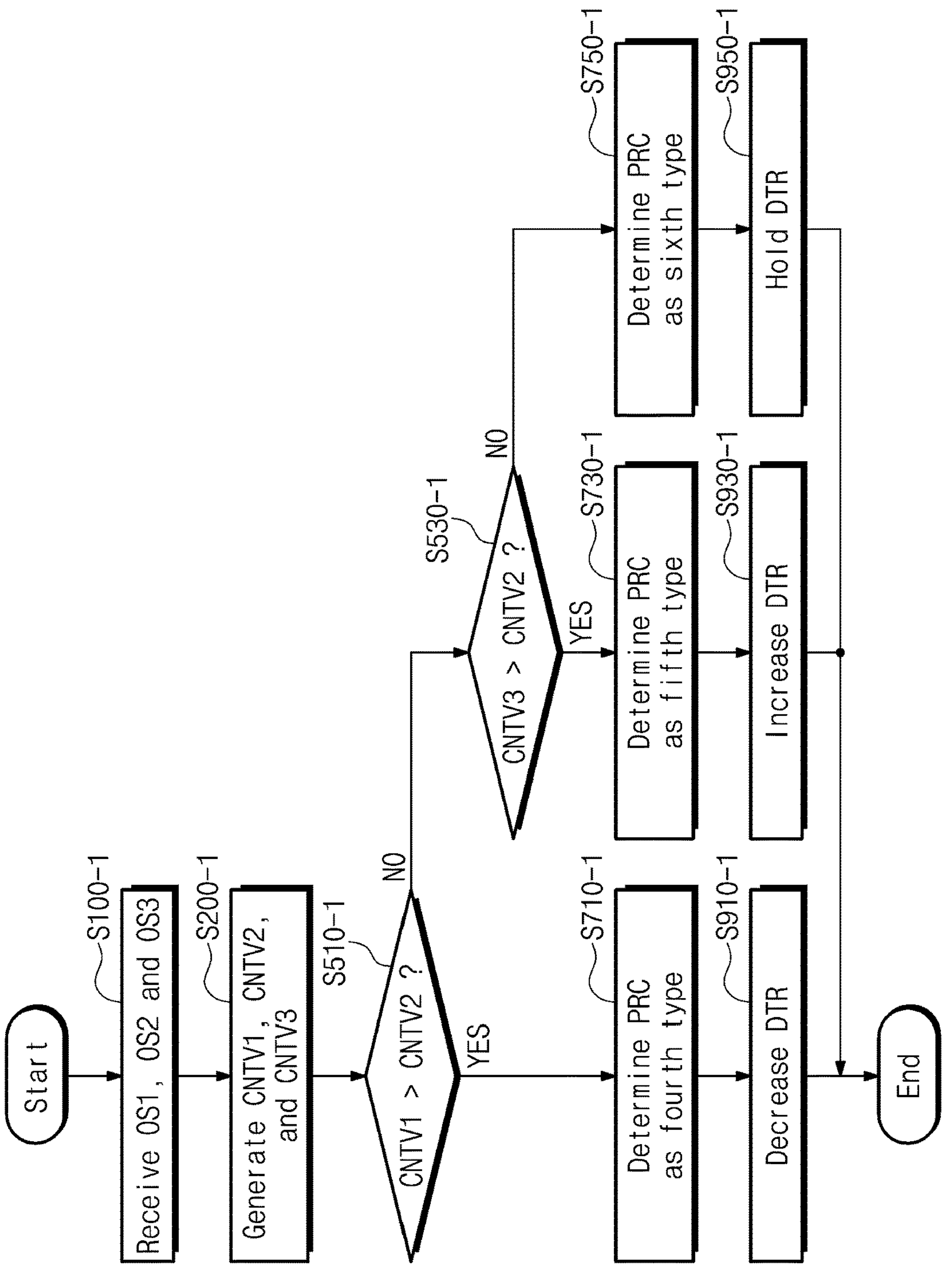
FIG. 12 is flowchart illustrating an embodiment in which a control circuit of FIG. 5 including a process corner determiner of FIG. 11 operates.

FIG. 12 is flowchart illustrating an embodiment in which a control circuit of FIG. 5 including a process corner determiner of FIG. 11 operates.

Referring to FIGS. 5, 11, and 12, the control circuit 700 receives the plurality of oscillation signals OS1, OS2, and OS3 (S100-1).

The counter 710 counts the plurality of oscillation signals OS1, OS2, and OS3 to generate the plurality of count values CNTV1, CNTV2, and CNTV3 (S200-1).

The process corner determiner 730*b* determines whether the count value CNTV1 is greater than the count value CNTV2 (S510-1). If the count value CNTV1 is not greater than the count value CNTV2, the process corner determiner 730*b* determines whether the count value CNTV3 is greater than the count value CNTV2 (S530-1). The process corner determiner 730*b* may classify types of a process corner depending on determination results of operation S510-1 and operation S530-1. As described with reference to FIG. 7, the process corner determiner 730*b* may classify types of a process corner in a manner different from that of the process corner determiner 730*a*. For example, the fourth to sixth types of the process corner that are classified by the process corner determiner 730*b* may be different from the first to third types of the process corner that are classified by the process corner determiner 730*a*.

When the count value CNTV1 is greater than the count value CNTV2 (YES in operation S510-1), the process corner determiner 730*b* determines that the process corner has the fourth type (S710-1). The control signal generator 750 decreases a duty ratio DTR of the internal clock signal upon determining that the process corner has the fourth type (S910-1). In an embodiment, the fourth type corresponds to a case where a PMOS transistor and an NMOS transistor of a semiconductor device are manufactured to be unbalanced, in association with the performance condition of the hardware specifications of the semiconductor device. For example, the fourth type may correspond to the case where the PMOS and NMOS transistors are manufactured such that a speed of the PMOS transistor is relatively faster than a speed of the NMOS transistor.

When the count value CNTV1 is smaller than or equal to the count value CNTV2 (NO in operation S510-1) and when the count value CNTV3 is greater than the count value CNTV2 (YES in operation S530-1), the process corner determiner 730*b* determines that the process corner has the fifth type (S730-1). The control signal generator 750 increases the duty ratio DTR of the internal clock signal upon determining that the process corner has the fifth type (S930-1). The fifth type may correspond to the case where a PMOS transistor and an NMOS transistor of a semiconductor device are manufactured to be unbalanced, in association with the performance condition of the hardware specifications of the semiconductor device. For example, the fifth type may correspond to the case where the PMOS and NMOS transistors are manufactured such that a speed of the PMOS transistor is relatively slower than a speed of the NMOS transistor.

In an embodiment, the process corner determiner 730*b* performs operation S530-1 immediately after operation S200-1 without performing operation S510-1 to determine that the process corner has the fifth type. For example, when the count value CNTV3 is greater than the count value CNTV2 (YES in operation S530-1), the process corner determiner 730*b* may determine that the process corner has the fifth type (S730-1).

When the count value CNTV1 is smaller than or equal to the count value CNTV2 (NO in operation S510-1) and when the count value CNTV3 is smaller than or equal the count value CNTV2 (NO in operation S530-1), the process corner determiner 730*b* determines that the process corner has the sixth type (S750-1). The control signal generator 750 holds or maintains the duty ratio DTR of the internal clock signal upon determining that the process corner has the sixth type (S950-1). The sixth type may correspond to the case where a PMOS transistor and an NMOS transistor of a semiconductor device are manufactured to be balanced, in association with the performance condition of the hardware specifications of the semiconductor device. For example, the sixth type may correspond to the case where the PMOS and NMOS transistors are manufactured such that a speed of the PMOS transistor is substantially identical to a speed of the NMOS transistor. The fourth type, the fifth type, and the sixth type will be described with reference to FIG. 13.

Figure 13:
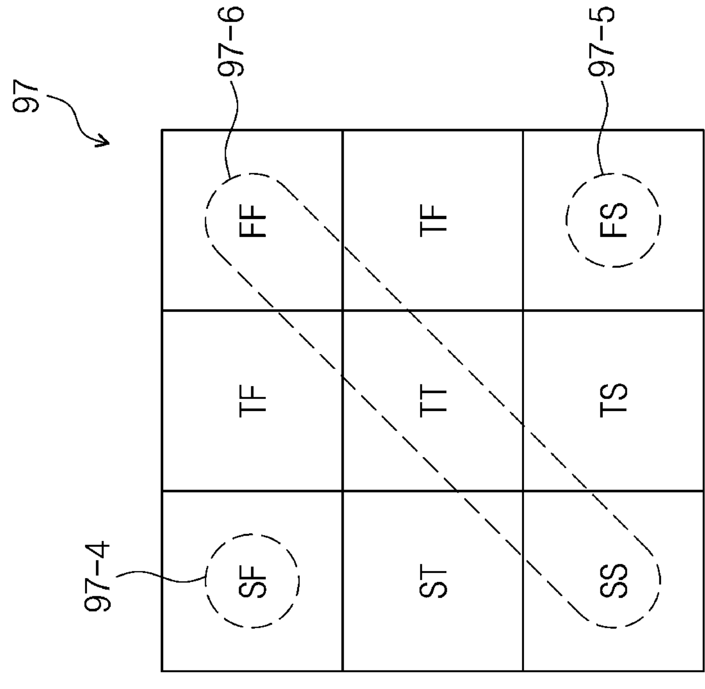
FIG. 13 is a diagram for describing a process corner determining process of FIG. 12.
Figure 13:
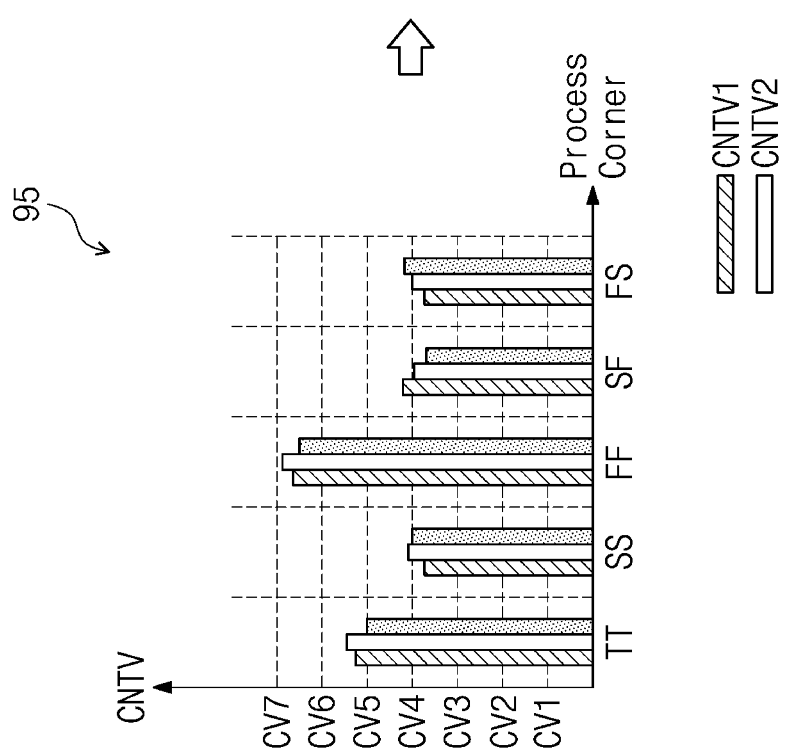

FIG. 13 is a diagram for describing a process corner determining process of FIG. 12 according to an embodiment.

In FIG. 13, reference numeral 95 indicates the count values CNTV1, CNTV2, and CNTV3 associated with the process corners "TT", "SS", "FF", "SF", and "FS", and reference numeral 97 indicates the fourth type, the fifth type, and the sixth type. The count values CNTV1, CNTV2, and CNTV3 indicated by reference numeral 95 of FIG. 13 may be data that are collected through a test operation performed in advance before a drive signal supply device according to an embodiment of the present disclosure operates. For example, the plurality of count values CNTV1, CNTV2, and CNTV3 may be collected from a plurality of test semiconductor devices that are manufactured to indicate various process corners "TT", "SS", "FF", "SF", and "FS" and each of which includes a drive signal supply device (e.g., 100 of FIG. 1).

In an embodiment, the count values CNTV1, CNTV2, and CNTV3 collected from a test semiconductor device indicating the process corners "TT", "SF", and "FS" may be close to CV5. The count values CNTV1, CNTV2, and CNTV3 collected from a test semiconductor device indicating the process corner "SS" may be close to CV4. The count values CNTV1, CNTV2, and CNTV3 collected from a test semiconductor device indicating the process corner "FF" may be between CV6 and CV7. CV7 may be greater than CV6, CV6 may be greater than CV5, and CV5 may be greater than CV4.

In an embodiment, process corners corresponding to the count values CNTV1, CNTV2, and CNTV3 having the same pattern or similar patterns may be classified as one type of a process corner.

For example, referring to a box indicated by reference numeral 95 of FIG. 13, the process corner "SF" corresponding to the case where the count value CNTV1 is greater than the count value CNTV2 may be classified as a fourth type 97-4 of a process corner.

For example, the process corner "FS" corresponding to the case where the count value CNTV1 is smaller than or equal to the count value CNTV2 and the count value CNTV3 is greater than the count value CNTV2 may be classified as a fifth type 97-5 of a process corner.

For example, the process corners "FF", "TT", and "SS" corresponding to the case where the count value CNTV1 is smaller than or equal to the count value CNTV2 and the count value CNTV3 is smaller than or equal to the count value CNTV2 may be classified as a sixth type 97-6 of a process corner.

Figure 14:
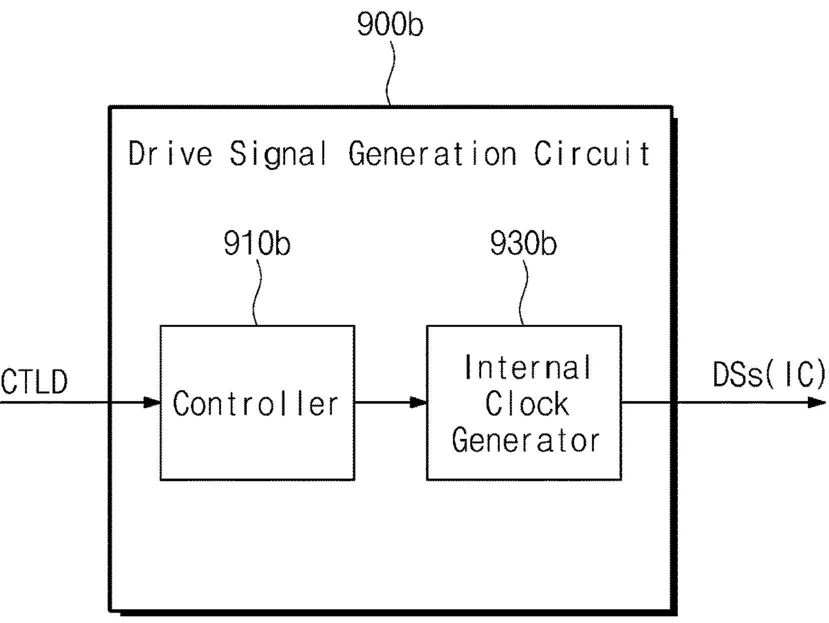
FIG. 14 is a block diagram illustrating an embodiment of the drive signal generation circuit of FIG. 1.

FIG. 14 is a block diagram illustrating an embodiment of a drive signal generation circuit of FIG. 1.

Referring to FIGS. 1 and 14, a drive signal generation circuit 900*b* may correspond to the drive signal generation circuit 150. The drive signal generation circuit 900*b* may receive the control signal CTLD from a control circuit (e.g., 700 of FIG. 5) including a process corner determiner (e.g., process corner determiner 730*b* of FIG. 11) and may generate or calibrate the one or more drive signals DSs including an internal clock signal IC.

The drive signal generation circuit 900*b* may include a controller 910*b* and an internal clock generator 930*b*. The controller 910*b* may control the internal clock generator 930*b* based on the control signal CTLD. The internal clock generator 930*b* may generate or calibrate the one or more drive signals DSs including the internal clock IC under control of the controller 910*b*.

In an embodiment, under control of the controller 910*b*, the internal clock generator 930*b* may calibrate the internal clock signal IC by decreasing, holding, or increasing the duty ratio of the internal clock IC in operation S910-1, operation S930-1, or operation S950-1.

As described with reference to FIG. 12, the process corner determiner 730*b* may determine the process corner by comparing a plurality of count values with each other. An oscillation circuit (e.g., 500 of FIG. 4A) may include a plurality of oscillators, and the plurality of oscillators may include a first oscillator outputting a first oscillation signal, a second oscillator outputting a second oscillation signal, and a third oscillator outputting a third oscillation signal.

In an embodiment, each of inverters included in the first oscillator may have a first ratio of channel widths, each of inverters included in the second oscillator may have a second ratio of channel widths, and each of inverters included in the third oscillator may have a third ratio of channel widths. The second ratio of channel widths may be greater than the first ratio of channel widths, and the third ratio of channel widths may be greater than the first ratio of channel widths.

The process corner determiner 730*b* may determine the process corner by comparing a frequency of the first oscillation signal, a frequency of the second oscillation signal, and a frequency of the third oscillation signal. In an embodiment, a counter (e.g., 710 of FIG. 5) may count the rising edge or falling edge of each of the first oscillation signal, the second oscillation signal, and the third oscillation signal to generate respective count values. As a frequency of an oscillation signal increases, the count value obtained by counting the oscillation signal may increase.

In an embodiment, the counter counts the first oscillation signal to generate a first count value, counts the second oscillation signal to generate a second count value, and counts the third oscillation signal to generate a third count value. The process corner determiner 730*b* may compare the frequency of the first oscillation signal, the frequency of the second oscillation signal, and the frequency of the third oscillation signal by comparing the first count value, the second count value, and the third count value.

In an embodiment, when the frequency of the first oscillation signal is higher than the frequency of the second oscillation signal (e.g., when the count value CNTV1 is greater than the count value CNTV2), the process corner determiner 730*b* may determine that the process corner has the fourth type, and a control signal generator (e.g., 750 of FIG. 5) may decrease the duty ratio of the internal clock signal upon determining that the process corner has the fourth type.

In an embodiment, when the frequency of the first oscillation signal is lower than or equal to the frequency of the second oscillation signal and when the frequency of the third oscillation signal is higher than the frequency of the second oscillation signal (e.g., the count value CNTV1 is smaller than or equal to the count value CNTV2 and when the count value CNTV3 is greater than the count value CNTV2), the process corner determiner 730*b* may determine that the process corner has the fifth type, and the control signal generator may increase the duty ratio of the internal clock signal upon determining that the process corner has the fifth type.

In an embodiment, when the frequency of the first oscillation signal is lower than or equal to the frequency of the second oscillation signal and when the frequency of the third oscillation signal is lower than or equal to the frequency of the second oscillation signal (e.g., the count value CNTV1 is smaller than or equal to the count value CNTV2 and when the count value CNTV3 is smaller than or equal to the count value CNTV2), the process corner determiner 730*b* may determine that the process corner has the sixth type, and the control signal generator may hold the duty ratio of the internal clock signal upon determining that the process corner has the sixth type.

Figure 15:
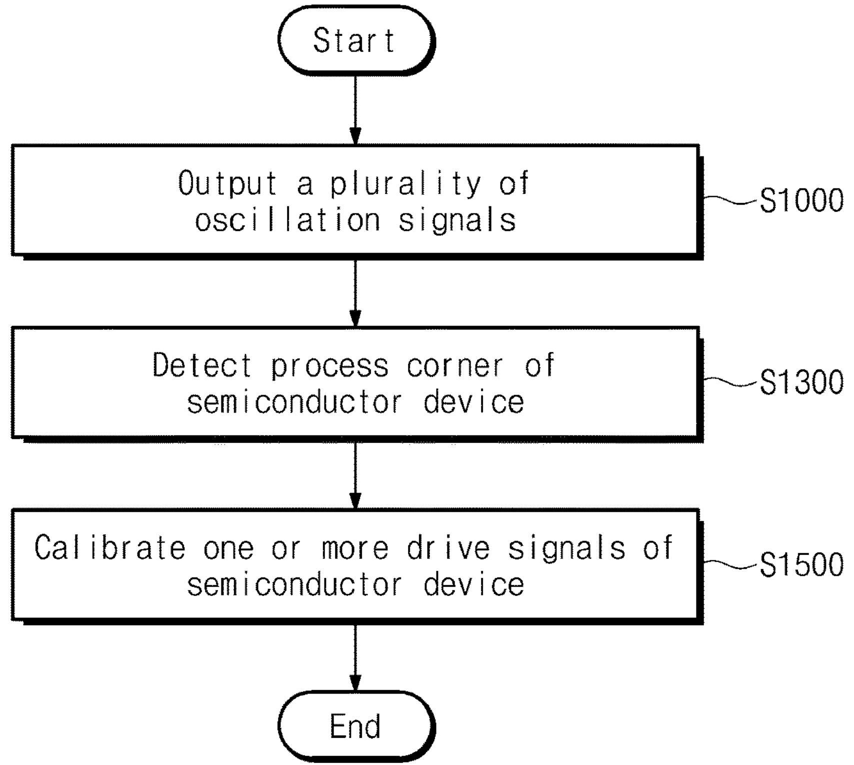
FIG. 15 is a flowchart illustrating a drive signal calibrating method according to an embodiment of the present disclosure.

FIG. 15 is a flowchart illustrating a drive signal calibrating method according to an embodiment of the present disclosure.

Referring to FIG. 15, in the drive signal calibrating method, a plurality of oscillation signals are output (S1000).

In an embodiment, operation S1000 is performed by an oscillation circuit (e.g., 110 of FIG. 1 or 500 of FIG. 4A). For example, the oscillation circuit may include a plurality of oscillators, and each of the plurality of oscillators may include inverters. A switching characteristic of each inverter included in one of the plurality of oscillators may be different from a switching characteristic of each inverter included in another (or the other) of the plurality of oscillators. For example, each of the plurality of oscillators may be implemented with a ring oscillator. In this case, inverters included in each ring oscillator may have the same switching characteristic, but the inverters included in one ring oscillator and the inverters included in another (or the other) ring oscillator may have different switching characteristics.

A process corner of a semiconductor device is detected based on the plurality of oscillation signals (S1300).

In an embodiment, operation S1300 is performed by a control circuit (e.g., 700 of FIG. 5) or a process corner determiner (e.g., 730 of FIG. 5, 730*a* of FIG. 6, or 730*b* of FIG. 11). The process corner may be an index for identifying a process characteristic by classifying process distributions, which indicate process variations of a semiconductor device according to a semiconductor device manufacturing process, based on a given criterion.

In an embodiment, the process corner is detected by performing one or more operations including a comparison operation based on the plurality of oscillation signals. For example, the comparison operation may include operation S510 and operation S530 of FIG. 7 or may include operation S510-1 and operation S530-1 of FIG. 12.

One or more drive signals of the semiconductor device is calibrated based on the process corner (S1500).

In an embodiment, the number of ring oscillators included in the oscillation circuit may be determined depending on a type of a drive signal. For example, when the drive signal is the internal voltage, the number of ring oscillators may be 2 or more; when the drive signal is the internal clock signal, the number of ring oscillators may be 3 or more.

In an embodiment, in the process of detecting the process corner, two or more reference values may be used or may not be used depending on a type of the drive signal. When the drive signal is the internal voltage, the two or more reference values may be used; when the drive signal is the internal clock signal, the two or more reference values may not be used.

Figure 16:
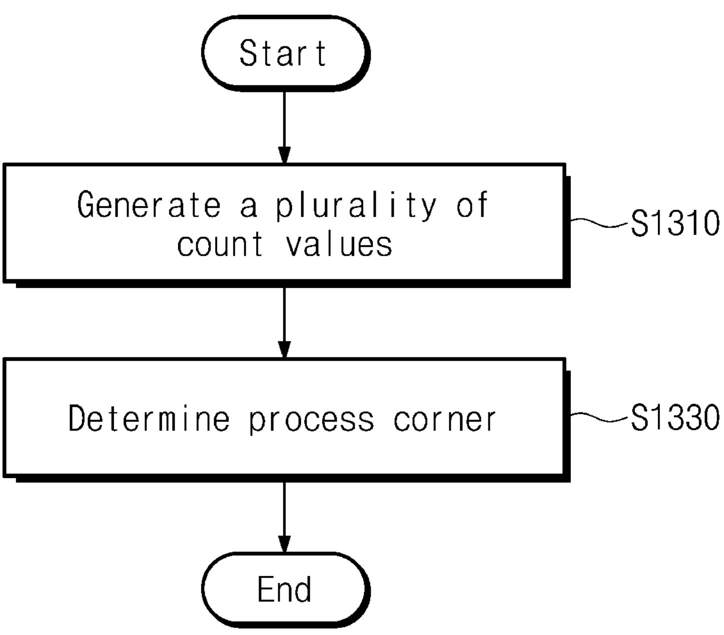
FIG. 16 is a block diagram illustrating an embodiment of the process of detecting a process corner, which is described with reference to FIG. 15.

FIG. 16 is a block diagram illustrating an embodiment of the process of detecting a process corner, which is described with reference to FIG. 15. For example, S1300 of FIG. 15 may be implemented by FIG. 16.

Referring to FIGS. 15 and 16, in the process of detecting the process corner, a plurality of count values is generated by counting the plurality of oscillation signals (S1310).

The process corner is determined based on the plurality of count values (S1330).

Figure 17:
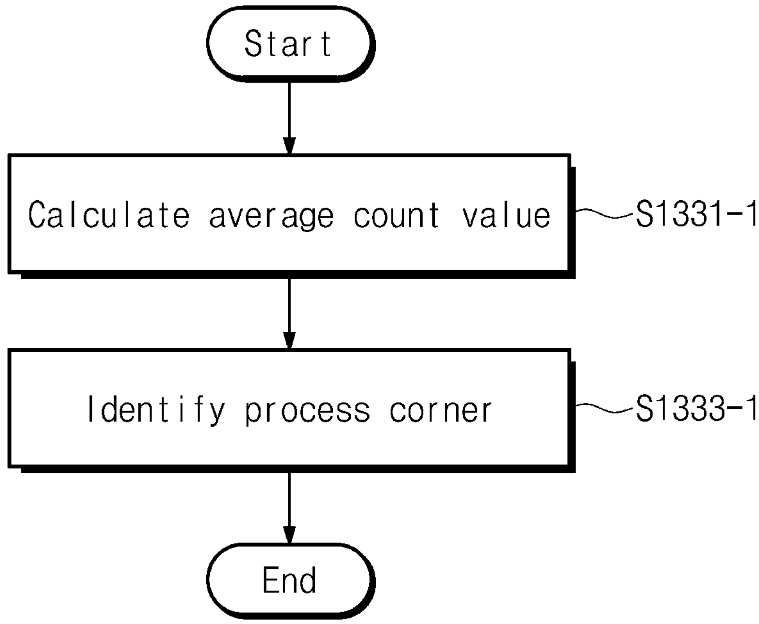
FIG. 17 is a block diagram illustrating an embodiment of the process of determining a process corner, which is described with reference to FIG. 16.

FIG. 17 is a block diagram illustrating an embodiment of the process of determining a process corner, which is described with reference to FIG. 15. For example, S1300 of FIG. 15 may be implemented by FIG. 17.

Referring to FIGS. 15 and 17, in the process of determining the process corner, an average count value is calculated by averaging the plurality of count values (S1331-1).

The process corner is identified (or determined) based on the average count value and two or more reference values for classifying types of the process corner (S1333-1).

In an embodiment, operation S1331-1 and operation S1333-1 may correspond to the embodiments described with reference to FIGS. 5 to 10.

Figure 18:
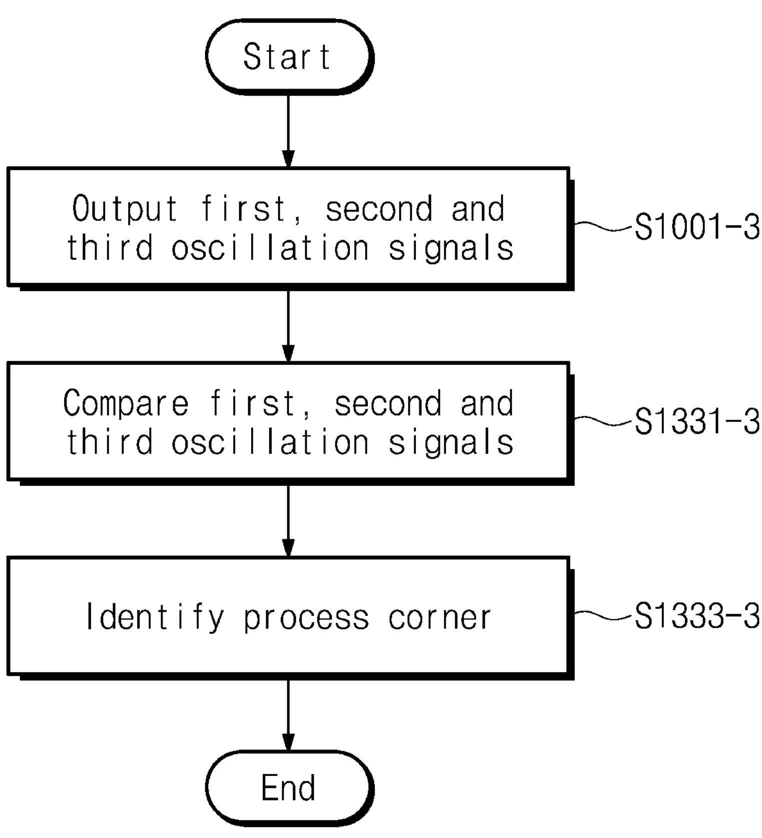
FIG. 18 is a block diagram illustrating an embodiment of the process of determining a process corner, which is described with reference to FIG. 16.

FIG. 18 is a block diagram illustrating an embodiment of the process of determining a process corner, which is described with reference to FIG. 16. For example, steps S1000 and S1300 of FIG. 15 may be implemented by FIG. 18.

Referring to FIGS. 15 and 18, in the outputting of the plurality of oscillation signals, a first oscillation signal, a second oscillation signal, and a third oscillation signal are output (S1001-3).

In the process of determining the process corner, the first oscillation signal, the second oscillation signal, and the third oscillation signal are compared (S1331-3).

In an embodiment, a frequency of the first oscillation signal, a frequency of the second oscillation signal, and a frequency of the third oscillation signal may be compared during step S1331-3.

In the process of determining the process corner, the process corner is identified (or determined) from the results calculated by comparing the first oscillation signal, the second oscillation signal and the third oscillation signal (S1333-3). The results may be generated by comparing the frequency of the first oscillation signal, the frequency of the second oscillation signal, and the frequency of the third oscillation signal.

In an embodiment, operation S1001-3, operation S1331-3, and operation S1333-3 may correspond to the embodiments described with reference to FIGS. 5 to 14.

Figure 19:
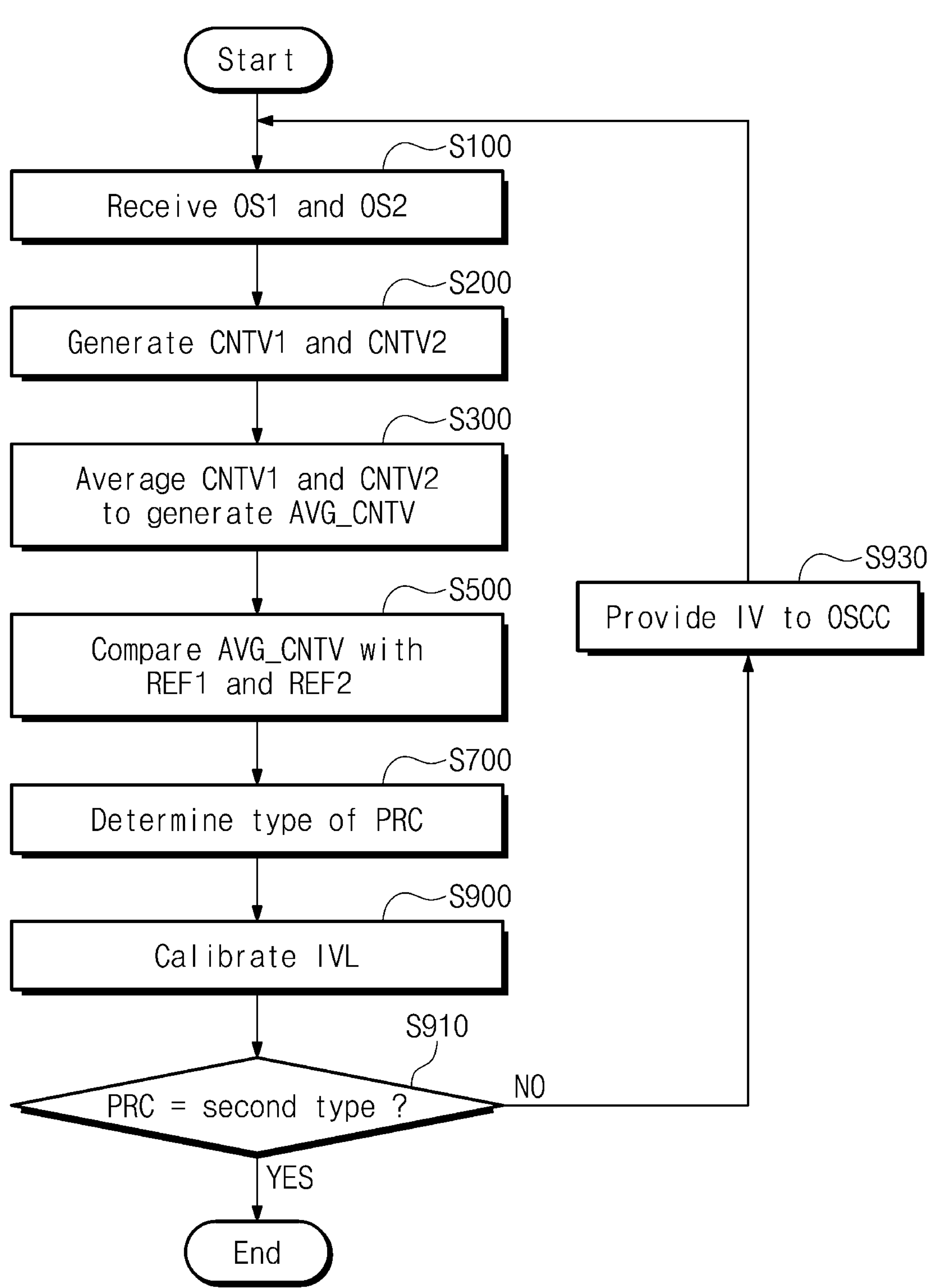
FIG. 19 is a flowchart illustrating a drive signal calibrating method according to an embodiment of the present disclosure.

FIG. 19 is a flowchart illustrating a drive signal calibrating method according to an embodiment of the present disclosure.

Referring to FIGS. 7 and 19, a control circuit receives the plurality of oscillation signals OS1 and OS2 (S100).

A counter counts the plurality of oscillation signals OS1 and OS2 and to generate the plurality of count values CNTV1 and CNTV2 (S200).

A process corner determiner averages the plurality of count values CNTV1 and CNTV2 to generate the average count value AVG_CNTV (S300).

The process corner determiner compares the average count value AVG_CNTV with the reference values REF1 and REF2 (S500) to determine a type of a process corner PRC (S700).

In an embodiment, the type of the process corner PRC is the first type, the second type, or the third type described with reference to FIG. 7. The first type or the third type may correspond to the case where transistors of a semiconductor device are manufactured such that a speed of the transistors is slow or fast compared to the defined speed range, in association with the performance condition of the hardware specifications according the semiconductor device. The second type may correspond to the case where transistors of a semiconductor device are manufactured such that a speed of the transistors satisfies the defined speed range, in association with the performance condition of the hardware specifications of the semiconductor device.

The process corner determiner may calibrate (or adjust) the voltage level IVL of the internal voltage IV based on the process corner PRC (S900).

In an embodiment, when the process corner PRC corresponds to the first type or the third type, the process corner determiner may increase or decrease the voltage level IVL of the internal voltage IV. When the process corner PRC corresponds to the second type, the process corner determiner may hold the voltage level IVL of the internal voltage IV.

The process corner determiner determines whether the process corner PRC corresponds to the second type (S910).

When the process corner PRC does not correspond to the second type (NO in operation S910), a control signal generator provides the internal voltage IV of the increased or decreased voltage level as a feedback signal (e.g., FDS of FIG. 1) to an oscillation circuit OSCC. For example, the internal voltage IV of the increased or decreased voltage level may be provided as a power supply voltage (e.g., VDD of FIG. 4A) to the oscillation circuit OSCC.

In an embodiment, the oscillation circuit may again output the plurality of oscillation signals OS1 and OS2, and the control circuit may generate a control signal (e.g., CTLD of FIGS. 1 and 5) based on a result of again determining the process corner PRC of the semiconductor device by using the oscillation signals OS1 and OS2 thus again output.

In an embodiment, operations S100, S200, S300, S500, S700, S900, S910 and S930 are repeatedly performed until the process corner PRC corresponds to the second type.

When the process corner PRC corresponds to the second type (YES in operation S910), the control signal generator may output the internal voltage IV to the semiconductor device.

Figure 20:
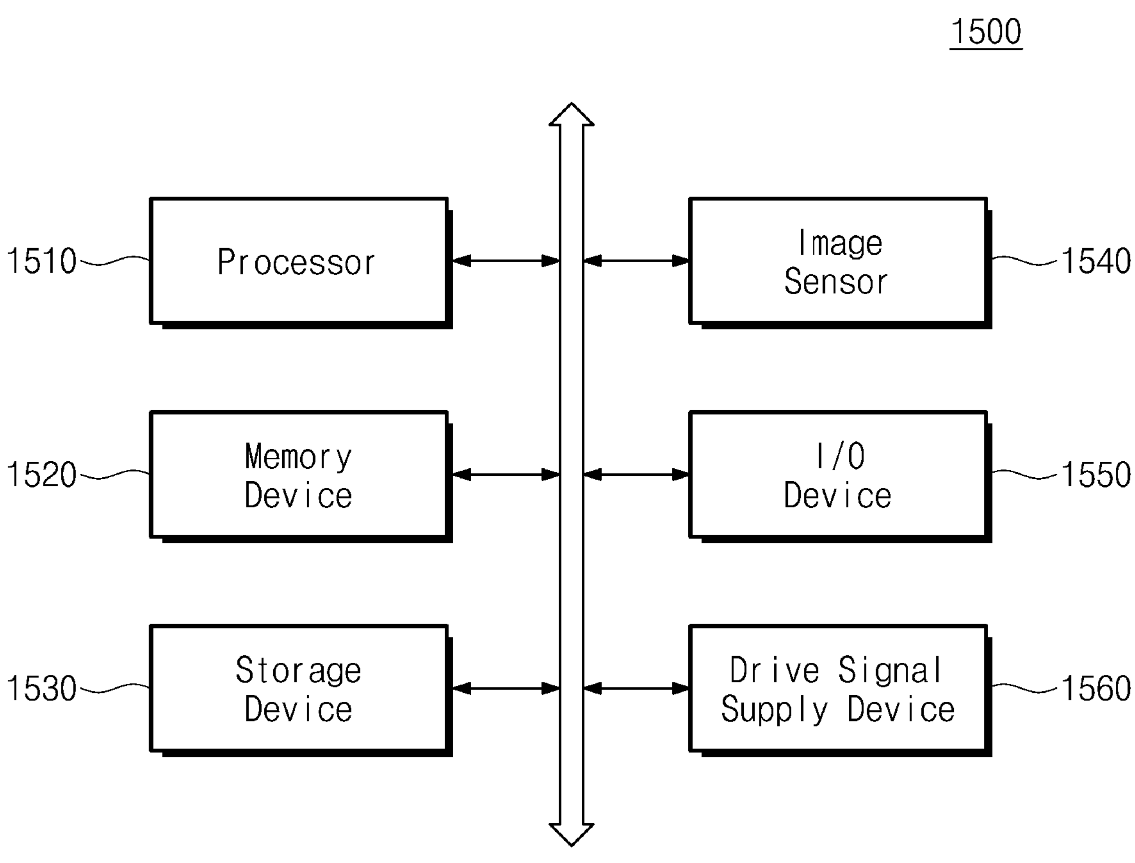
FIG. 20 is a block diagram illustrating an electronic system including a drive signal supply device according to an embodiment of the present disclosure.

FIG. 20 is a block diagram illustrating an electronic system including a drive signal supply device according to an embodiment of the present disclosure.

Referring to FIG. 20, an electronic system 1500 may include a processor 1510, a memory device 1520, a storage device 1530, an image sensor 1540, an input/output device 1550, and a drive signal supply device 1560. The electronic system 1500 may communicate with a video card, a sound card, a memory card, a universal serial bus (USB) device, etc. or may further include ports capable of communicating with any other electronic devices.

The processor 1510 may perform specific calculations or tasks. In an embodiment, the processor 1510 may be a micro-processor or a central processing unit (CPU).

The processor 1510 may communicate with the memory device 1520, the storage device 1530, the image sensor 1540, and the input/output device 1550 through at least one of an address bus, a control bus, and a data bus.

In an embodiment, the processor 1510 may also be connected to an expansion bus such as a peripheral component interconnect (PCI) bus.

The memory device 1520 may store data necessary for the operation of the electronic system 1500. For example, the memory device 1520 may be implemented with a dynamic RAM (DRAM), a mobile DRAM, a static RAM (SRAM), a phase change RAM (PRAM), a ferroelectric RAM (FRAM), a resistive RAM (RRAM), and/or a magnetoresistive RAM (MRAM).

The storage device 1530 may include a solid state drive (SSD), a hard disk drive (HDD), a CD-ROM, etc.

The input/output device 1550 may include input devices such as a keyboard, a keypad, and a mouse and output devices such as a printer and a display.

The drive signal supply device 1560 may supply a drive signal for the operation of the electronic system 1500. For example, the drive signal supply device 1560 may generate one or more drive signals so as to be supplied to the components 1510, 1520, 1530, 1540, and 1550 of the electronic system 1500. For example, the one or more drive signals may include an internal voltage or an internal clock signal, and the drive signal supply device 1560 may correspond to the drive signal supply device according to embodiments of the present disclosure.

The image sensor 1540 may be connected to the processor 1510 through the buses or any other communication link and may perform communication.

Through the above configuration, a drive signal supply device according to an embodiment of the present disclosure may detect a process corner as a process characteristic of a semiconductor device by using a plurality of oscillators outputting a plurality of oscillation signals having different oscillation periods or different oscillation frequencies and may generate and calibrate one or more drive signals to be supplied to each component included in the semiconductor device based on the process corner.

The one or more drive signals satisfying a performance condition of the hardware specifications may be supplied to the semiconductor device through the drive signal supply device regardless of the PVT variations. Thus, the performance of the semiconductor device may be prevented from deteriorating.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A drive signal supply device comprising:

an oscillation circuit including a plurality of oscillators each including inverters, and configured to output a plurality of oscillation signals, wherein a switching characteristic of each of the inverters included in one of the plurality of oscillators is different from a switching characteristic of each of the inverters included in another of the plurality of oscillators;

a control circuit configured to detect a process corner of a semiconductor device based on the plurality of oscillation signals to generate a control signal; and a drive signal generation circuit configured to generate a drive signal for the semiconductor device based on the control signal, wherein the control circuit is configured to increase a voltage level of the drive signal to be provided as an internal voltage to the semiconductor device upon determining that an average of a plurality of count values of the plurality of oscillation signals is smaller than a first reference value.

2. The drive signal supply device of claim 1, wherein the control circuit comprises:

a counter configured to count the plurality of oscillation signals to generate the plurality of count values;

a logic circuit configured to determine the process corner based on the plurality of count values; and a control signal generator configured to generate the control signal based on the process corner.

3. The drive signal supply device of claim 2, wherein the logic circuit is configured to:

determine the process corner based on the plurality of count values and reference values including the first reference value for classifying types of the process corner.

4. The drive signal supply device of claim 3, wherein the logic circuit is configured to:

calculate the average by averaging the plurality of count values; and determine the process corner based on a result of comparing the average with the reference values.

5. The drive signal supply device of claim 4, wherein the logic circuit is configured to determine that the process corner is of a first type when the average count value-is smaller than the first reference value, and wherein the control signal generator is configured to increase the voltage level of the internal voltage upon determining that the process corner is of the first type.

6. The drive signal supply device of claim 5, wherein, after increasing the voltage level of the internal voltage, the control signal generator is configured to provide the internal voltage of the increased voltage level to the oscillation circuit, wherein the oscillation circuit is configured to output a second plurality of oscillation signals, and wherein the control circuit is configured to determine again the process corner of the semiconductor device based on the second plurality of oscillation signals to generate the control signal.

7. The drive signal supply device of claim 5, wherein the reference values further include a second reference value greater than the first reference value, wherein the logic circuit is configured to determine that the process corner is of a second type when the average is greater than or equal to the first reference value and when the average is smaller than the second reference value, and wherein the control signal generator is configured to maintain the voltage level of the internal voltage upon determining that the process corner is of the second type.

8. The drive signal supply device of claim 1, wherein each of the inverters included in each of the plurality of oscillators includes a p-type metal oxide semiconductor (PMOS) transistor and an n-type metal oxide semiconductor (NMOS) transistor, wherein each of the inverters included in each of the plurality of oscillators has a ratio of channel widths being a ratio of a channel width of the PMOS transistor and a channel width of the NMOS transistor, and wherein the ratio of channel widths of each of the inverters included in one of the plurality of oscillators is different from the ratio of channel widths of each of the inverters included in another of the plurality of oscillators.

9. A drive signal supply device comprising:

an oscillation circuit including a plurality of oscillators each including inverters, and configured to output a plurality of oscillation signals, wherein a switching characteristic of each of the inverters included in one of the plurality of oscillators is different from a switching characteristic of each of the inverters included in another of the plurality of oscillators;

a control circuit configured to detect a process corner of a semiconductor device based on the plurality of oscillation signals to generate a control signal; and a drive signal generation circuit configured to generate a drive signal for the semiconductor device based on the control signal, wherein the drive signal of the semiconductor device is an internal clock signal to be provided to the semiconductor device, wherein the control circuit is configured to determine the process corner based on a result of comparing a plurality of count values of the plurality of oscillation signals with each other, wherein the plurality of oscillators include:

a first oscillator configured to output a first oscillation signal;

a second oscillator configured to output a second oscillation signal; and a third oscillator configured to output a third oscillation signal, wherein each of inverters included in the first oscillator has a first ratio of channel widths, each of inverters included in the second oscillator has a second ratio of channel widths, and each of inverters included in the third oscillator has a third ratio of channel widths, wherein the second ratio of channel widths is greater than the first ratio of channel widths, and the third ratio of channel widths is greater than the second ratio of channel widths, and wherein the control circuit is configured to determine the process corner based on a result of comparing a frequency of the first oscillation signal, a frequency of the second oscillation signal, and a frequency of the third oscillation signal.

10. The drive signal supply device of claim 9, wherein the control circuit is configured to:

count the first oscillation signal to generate a first count value;

count the second oscillation signal to generate a second count value;

count the third oscillation signal to generate a third count value; and compare the frequency of the first oscillation signal and the frequency of the second oscillation signal by comparing the first count value and the second count value.

11. The drive signal supply device of claim 10, wherein, when the frequency of the first oscillation signal is higher than the frequency of the second oscillation signal, the control circuit determines that the process corner is of a first type, and wherein the control circuit is configured to decrease a duty ratio of the internal clock signal upon determining that the process corner is of the first type.

12. The drive signal supply device of claim 11, wherein, when the first count value is greater than the second count value, the control circuit determines that the process corner is of the first type.

13. The drive signal supply device of claim 9, wherein, when the frequency of the third oscillation signal is higher than the frequency of the second oscillation signal, the control circuit determines that the process corner is of a second type, and wherein the control circuit is configured to increase a duty ratio of the internal clock signal upon determining that the process corner is of the second type.

14. The drive signal supply device of claim 9, wherein, when the frequency of the first oscillation signal is lower than or equal to the frequency of the second oscillation signal and when the frequency of the third oscillation signal is lower than or equal to the frequency of the second oscillation signal, the control circuit determines that the process corner is of a third type, and wherein the control circuit is configured to maintain a duty ratio of the internal clock signal upon determining that the process corner is of the third type.

15. A method of calibrating a drive signal, the method comprising:

outputting first to third oscillation signals by an oscillation circuit including first to third oscillators, wherein each of inverters included in the first oscillator has a first ratio of channel widths, each of inverters included in the second oscillator has a second ratio of channel widths, and each of inverters included in the third oscillator has a third ratio of channel widths, wherein the second ratio of channel widths is greater than the first ratio of channel widths, and the third ratio of channel widths is greater than the second ratio of channel widths;

determining a process corner of a semiconductor device based on the first to third oscillation signals; and calibrating the drive signal as an internal clock signal to be provided to the semiconductor device based on the process corner, wherein the determining of the process corner comprises identifying the process corner based on a result of comparing a frequency of the first oscillation signal, a frequency of the second oscillation signal, and a frequency of the third oscillation signal.

16. The method of claim 15, further comprising: when the frequency of the first oscillation signal is higher than the frequency of the second oscillation signal, determining that the process corner is of a first type; and decreasing a duty ratio of the internal clock signal upon determining that the process corner is of the first type.

17. The method of claim 15, further comprising: when the frequency of the third oscillation signal is higher than the frequency of the second oscillation signal, determining that the process corner is of a second type; and increasing a duty ratio of the internal clock signal upon determining that the process corner is of the second type.

18. The method of claim 15, further comprising: when the frequency of the first oscillation signal is lower than or equal to the frequency of the second oscillation signal and when the frequency of the third oscillation signal is lower than or equal to the frequency of the second oscillation signal, determining that the process corner is of a third type; and maintaining a duty ratio of the internal clock signal upon determining that the process corner is of the third type.

* * * * *